(12) United States Patent
Huang et al.

(10) Patent No.: US 12,288,716 B2
(45) Date of Patent: Apr. 29, 2025

(54) PHASE CONTROL IN CONTACT FORMATION

(71) Applicant: Taiwan Semiconductor Manufacturing Co., Ltd., Hsinchu (TW)

(72) Inventors: Chun-Hsien Huang, Hsinchu (TW); I-Li Chen, Hsinchu (TW); Pin-Wen Chen, Keelung (TW); Yuan-Chen Hsu, Hsinchu (TW); Wei-Jung Lin, Hsinchu (TW); Chih-Wei Chang, Hsinchu (TW); Ming-Hsing Tsai, Chu-Pei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/648,979

(22) Filed: Apr. 29, 2024

(65) Prior Publication Data
US 2024/0282626 A1 Aug. 22, 2024

Related U.S. Application Data

(60) Continuation of application No. 17/809,922, filed on Jun. 30, 2022, now Pat. No. 12,002,712, which is a (Continued)

(51) Int. Cl.
*H01L 21/768* (2006.01)
*H01L 23/522* (2006.01)
*H01L 23/532* (2006.01)

(52) U.S. Cl.
CPC .. *H01L 21/76861* (2013.01); *H01L 21/76805* (2013.01); *H01L 21/76826* (2013.01);
(Continued)

(58) Field of Classification Search
None
See application file for complete search history.

(56) References Cited

U.S. PATENT DOCUMENTS

| 4,954,214 A | 9/1990 | Ho |
| 5,126,825 A | 6/1992 | Harada |

(Continued)

FOREIGN PATENT DOCUMENTS

| JP | H053170 A | 1/1993 |
| JP | 2000294630 A | 10/2000 |

(Continued)

OTHER PUBLICATIONS

Liu, Jiaxing, "Deposition and Characterization of Magnetron Sputtered Beta-Tungsten Thin Films," Columbia University, 2016, 131 pages.

*Primary Examiner* — Benjamin P Sandvik
(74) *Attorney, Agent, or Firm* — Slater Matsil, LLP

(57) ABSTRACT

A method includes forming a first metallic feature, forming a dielectric layer over the first metallic feature, etching the dielectric layer to form an opening, with a top surface of the first metallic feature being exposed through the opening, and performing a first treatment on the top surface of the first metallic feature. The first treatment is performed through the opening, and the first treatment is performed using a first process gas. After the first treatment, a second treatment is performed through the opening, and the second treatment is performed using a second process gas different from the first process gas. A second metallic feature is deposited in the opening.

20 Claims, 25 Drawing Sheets

Related U.S. Application Data division of application No. 16/392,067, filed on Apr. 23, 2019, now Pat. No. 11,410,880.

(52) U.S. Cl.
CPC .. *H01L 21/76843* (2013.01); *H01L 21/76877* (2013.01); *H01L 23/5226* (2013.01); *H01L 23/53257* (2013.01); *H01L 23/53266* (2013.01)

(56) References Cited

U.S. PATENT DOCUMENTS

| | | | |
|---|---|---|---|
| 5,990,007 | A | 11/1999 | Kajita et al. |
| 6,006,764 | A | 12/1999 | Chu et al. |
| 6,245,654 | B1 | 6/2001 | Shih et al. |
| 6,323,121 | B1 | 11/2001 | Liu et al. |
| 6,457,477 | B1 | 10/2002 | Young et al. |
| 7,514,353 | B2 | 4/2009 | Weidman et al. |
| 9,754,822 | B1 | 9/2017 | Chou et al. |
| 10,840,134 | B2 | 11/2020 | Chou et al. |
| 2006/0252252 | A1 | 11/2006 | Zhu et al. |
| 2008/0081453 | A1 | 4/2008 | Kim et al. |
| 2010/0159694 | A1 | 6/2010 | Chandrashekar et al. |
| 2012/0032334 | A1* | 2/2012 | Lee .............. C23C 16/0272 257/E21.585 |
| 2013/0137262 | A1 | 5/2013 | Satoh |
| 2014/0154883 | A1 | 6/2014 | Huymayun et al. |
| 2014/0199850 | A1 | 7/2014 | Kim et al. |
| 2014/0220780 | A1 | 8/2014 | Lee et al. |
| 2015/0001517 | A1 | 1/2015 | Abe et al. |
| 2015/0200089 | A1 | 7/2015 | Suen et al. |
| 2017/0032975 | A1 | 2/2017 | Tai et al. |
| 2017/0221700 | A1 | 8/2017 | Suen et al. |
| 2018/0331044 | A1 | 11/2018 | Wu et al. |
| 2020/0335588 | A1 | 10/2020 | Huang et al. |

FOREIGN PATENT DOCUMENTS

| | | |
|---|---|---|
| KR | 20060075929 A | 7/2006 |
| TW | 200707640 A | 2/2007 |
| TW | 201732975 A | 9/2017 |

\* cited by examiner

PHASE CONTROL IN CONTACT FORMATION

PRIORITY CLAIM AND CROSS-REFERENCE

This application is a continuation of U.S. patent application Ser. No. 17/809,922, entitled "Phase Control in Contact Formation," filed on Jun. 30, 2022, which is a divisional of U.S. patent application Ser. No. 16/392,067, entitled "Phase Control in Contact Formation," filed on Apr. 23, 2019, now U.S. Pat. No. 11,410,880, issued Aug. 9, 2022, which applications are incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per unit chip area) has generally increased while geometry size (e.g., the smallest component (or line) that can be created using a fabrication process) has decreased. This scaling down process generally provides benefits by increasing production efficiency and lowering associated costs.

Accompanying the scaling down of devices, manufacturers are using new and different materials and/or combination of materials to facilitate the scaling down of devices. Scaling down, alone and in combination with new and different materials, has also led to challenges that may not have been presented by previous generations at larger geometries.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
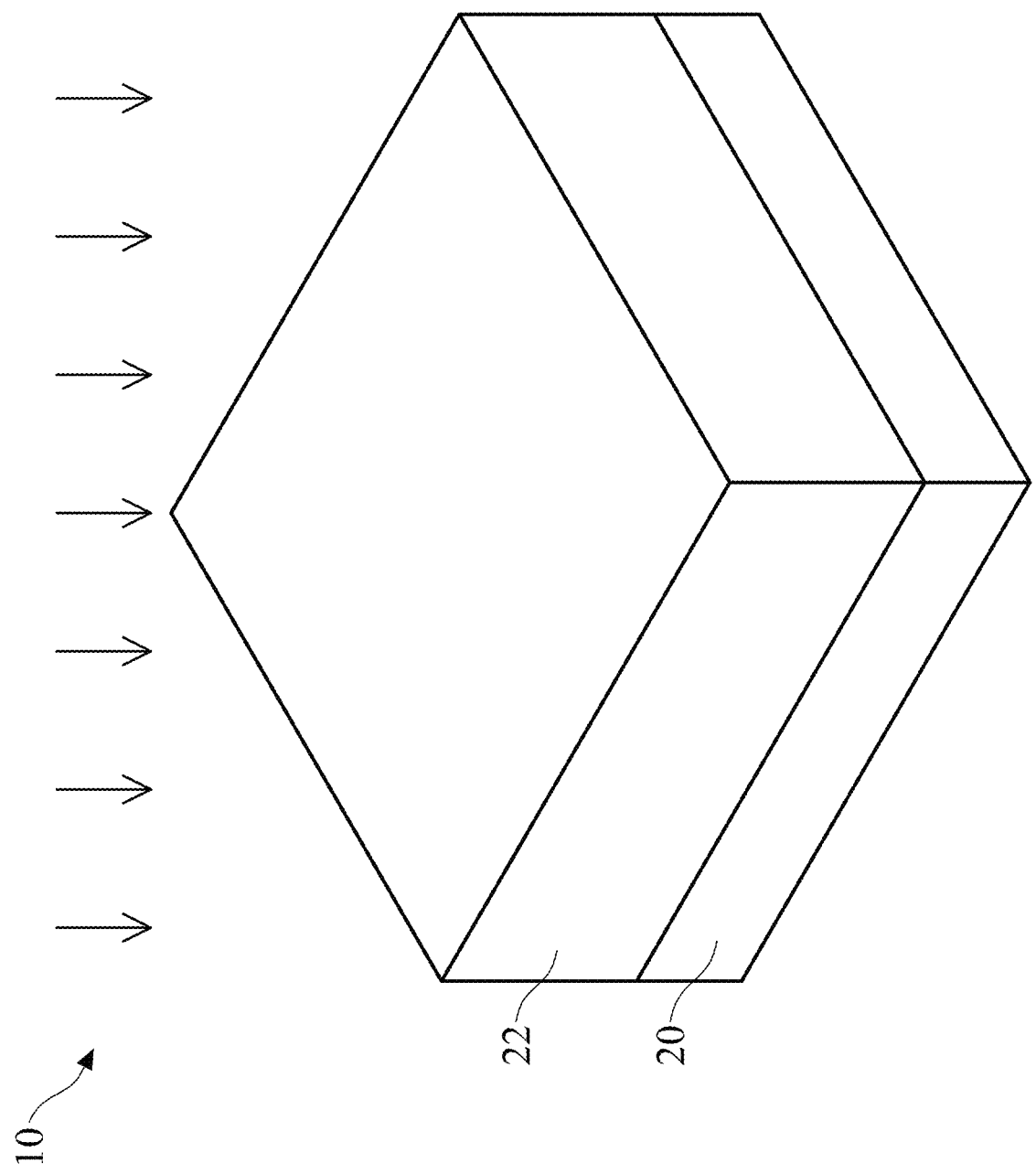
FIGS. 1-7, 8A, 8B, 9, 10, 11A, 11B, and 12-16 illustrate the perspective views and cross-sectional views of intermediate stages in the formation of Fin Field-Effect Transistors (FinFETs) and contact plugs in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Transistors and contact plugs and the corresponding formation processes are provided in accordance with various embodiments. The intermediate stages of forming the transistors and contact plugs are illustrated in accordance with some embodiments. Some variations of some embodiments are discussed. Throughout the various views and illustrative embodiments, like reference numbers are used to designate like elements. In accordance with some embodiments, the formation of Fin Field-Effect Transistors (FinFETs) is used as an example to explain the concept of the present disclosure. Other types of transistors such as planar transistors and Gate-All-Around (GAA) transistors and the corresponding contact plugs may also adopt the concept of the present disclosure.

In addition, the concept of the present disclosure may be applied to the formation of other connections whenever an upper metallic feature is formed to contact an underlying metallic feature such as metal lines, vias, contact plugs, or the like. In accordance with some embodiments of the present disclosure, the surfaces of the underlying metallic features are treated or implanted with certain elements such as oxygen, silicon, boron, phosphorous, arsenic, or the like, so that a more uniform phase formation may be resulted in the subsequently formed upper metallic features, and hence the resistivity of the upper metallic features throughout the respective wafer or die is more uniform.

Figure 23:
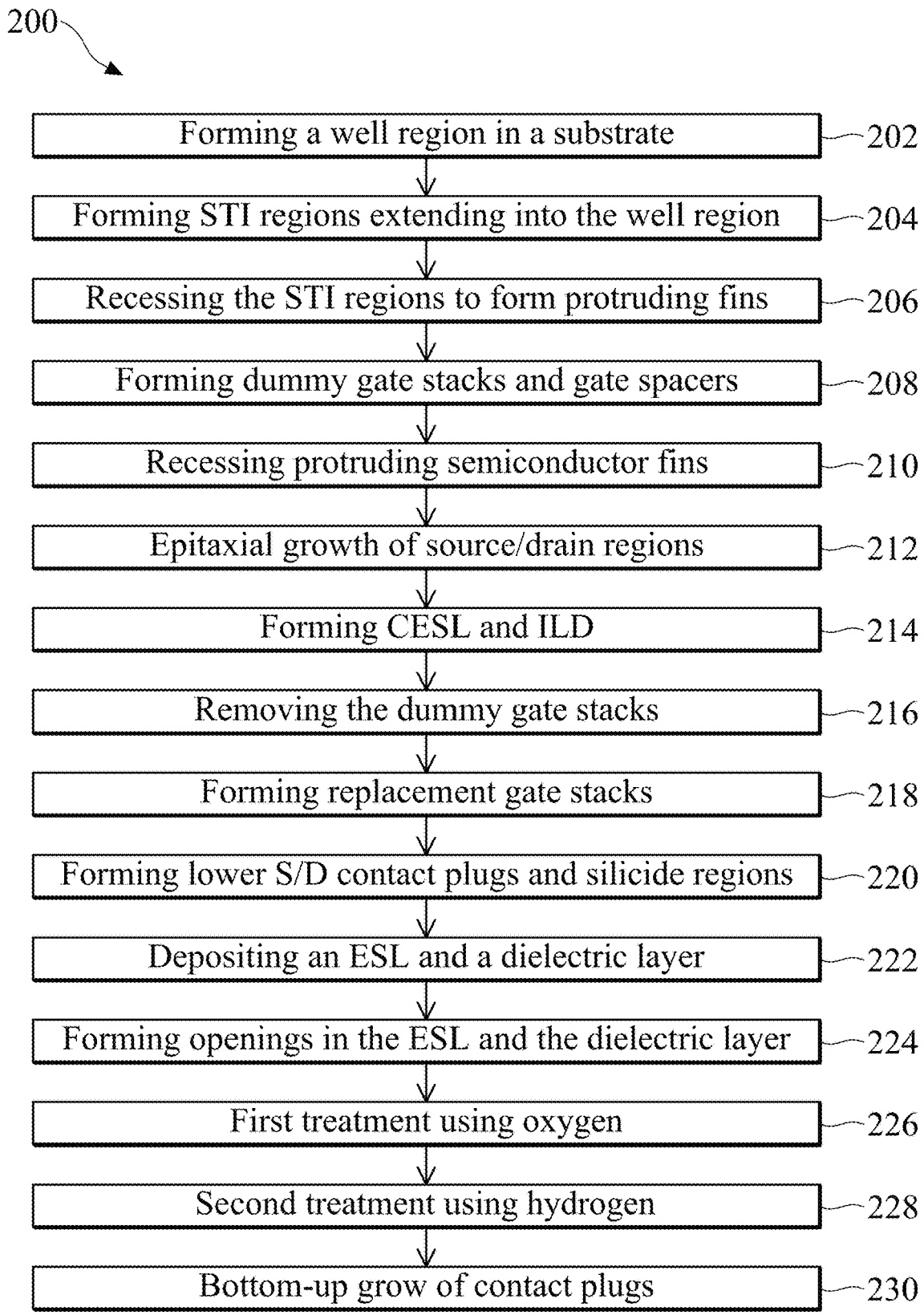
FIG. 23 illustrates a process flow for forming FinFETs and contact plugs in accordance with some embodiments.

FIGS. 1-7, 8A, 8B, 9, 10, 11A, 11B, and 12-16 illustrate the cross-sectional views and perspective views of intermediate stages in the formation of Fin Field-Effect Transistors (FinFETs) and contact plugs in accordance with some embodiments of the present disclosure. The processes shown in these figures are also reflected schematically in the process flow 200 as shown in FIG. 23.

In FIG. 1, substrate 20 is provided. The substrate 20 may be a semiconductor substrate, such as a bulk semiconductor substrate, a Semiconductor-On-Insulator (SOI) substrate, or the like, which may be doped (e.g., with a p-type or an n-type dopant) or undoped. The semiconductor substrate 20 may be a part of wafer 10, such as a silicon wafer. Generally, an SOI substrate is a layer of a semiconductor material formed on an insulator layer. The insulator layer may be, for example, a Buried Oxide (BOX) layer, a silicon oxide layer, or the like. The insulator layer is provided on a substrate, typically a silicon substrate or a glass substrate. Other substrates such as a multi-layered or gradient substrate may also be used. In some embodiments, the semiconductor material of semiconductor substrate 20 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Further referring to FIG. 1, well region 22 is formed in substrate 20. The respective process is illustrated as process 202 in the process flow 200 as shown in FIG. 23. In accordance with some embodiments of the present disclosure, well region 22 is an n-type well region formed through implanting an n-type impurity, which may be phosphorus, arsenic, antimony, or the like, into substrate 20. In accordance with other embodiments of the present disclosure, well region 22 is a p-type well region formed through implanting a p-type impurity, which may be boron, indium, or the like, into substrate 20. The resulting well region 22 may extend to the top surface of substrate 20. The n-type or p-type impurity concentration may be equal to or less than $10^{18}$ cm$^{-3}$, such as in the range between about $10^{17}$ cm$^{-3}$ and about $10^{18}$ cm$^{-3}$.

Figure 2:
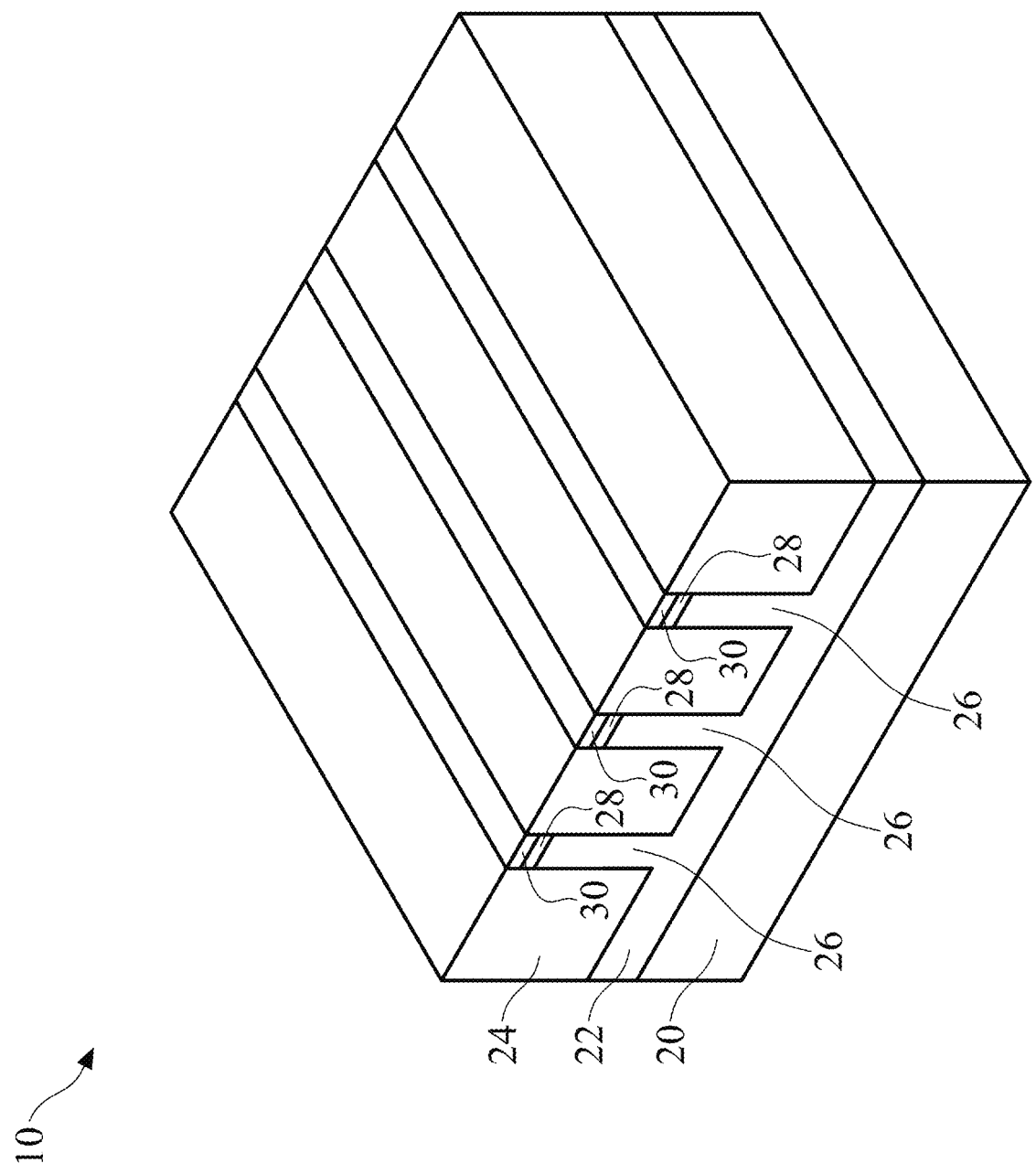

Referring to FIG. 2, isolation regions 24 are formed to extend from a top surface of substrate 20 into substrate 20. Isolation regions 24 are alternatively referred to as Shallow Trench Isolation (STI) regions hereinafter. The respective process is illustrated as process 204 in the process flow 200 as shown in FIG. 23. The portions of substrate 20 between neighboring STI regions 24 are referred to as semiconductor strips 26. To form STI regions 24, pad oxide layer 28 and hard mask layer 30 are formed on semiconductor substrate 20, and are then patterned. Pad oxide layer 28 may be a thin film formed of silicon oxide. In accordance with some embodiments of the present disclosure, pad oxide layer 28 is formed in a thermal oxidation process, wherein a top surface layer of semiconductor substrate 20 is oxidized. Pad oxide layer 28 acts as an adhesion layer between semiconductor substrate 20 and hard mask layer 30. Pad oxide layer 28 may also act as an etch stop layer for etching hard mask layer 30. In accordance with some embodiments of the present disclosure, hard mask layer 30 is formed of silicon nitride, for example, using Low-Pressure Chemical Vapor Deposition (LPCVD). In accordance with other embodiments of the present disclosure, hard mask layer 30 is formed by thermal nitridation of silicon, or Plasma Enhanced Chemical Vapor Deposition (PECVD). A photo resist (not shown) is formed on hard mask layer 30 and is then patterned. Hard mask layer 30 is then patterned using the patterned photo resist as an etching mask to form hard masks 30 as shown in FIG. 2.

Next, the patterned hard mask layer 30 is used as an etching mask to etch pad oxide layer 28 and substrate 20, followed by filling the resulting trenches in substrate 20 with a dielectric material(s). A planarization process such as a Chemical Mechanical Polish (CMP) process or a mechanical grinding process is performed to remove excess portions of the dielectric materials, and the remaining portions of the dielectric materials(s) are STI regions 24. STI regions 24 may include a liner dielectric (not shown), which may be a thermal oxide formed through a thermal oxidation of a surface layer of substrate 20. The liner dielectric may also be a deposited silicon oxide layer, silicon nitride layer, or the like formed using, for example, Atomic Layer Deposition (ALD), High-Density Plasma Chemical Vapor Deposition (HDPCVD), or Chemical Vapor Deposition (CVD). STI regions 24 may also include a dielectric material over the liner oxide, wherein the dielectric material may be formed using Flowable Chemical Vapor Deposition (FCVD), spin-on coating, or the like. The dielectric material over the liner dielectric may include silicon oxide in accordance with some embodiments.

The top surfaces of hard masks 30 and the top surfaces of STI regions 24 may be substantially level with each other. Semiconductor strips 26 are between neighboring STI regions 24. In accordance with some embodiments of the present disclosure, semiconductor strips 26 are parts of the original substrate 20, and hence the material of semiconductor strips 26 is the same as that of substrate 20. In accordance with alternative embodiments of the present disclosure, semiconductor strips 26 are replacement strips formed by etching the portions of substrate 20 between STI regions 24 to form recesses, and performing an epitaxy to regrow another semiconductor material in the recesses. Accordingly, semiconductor strips 26 are formed of a semiconductor material different from that of substrate 20. In accordance with some embodiments, semiconductor strips 26 are formed of silicon germanium, silicon carbon, or a III-V compound semiconductor material.

Figure 3:
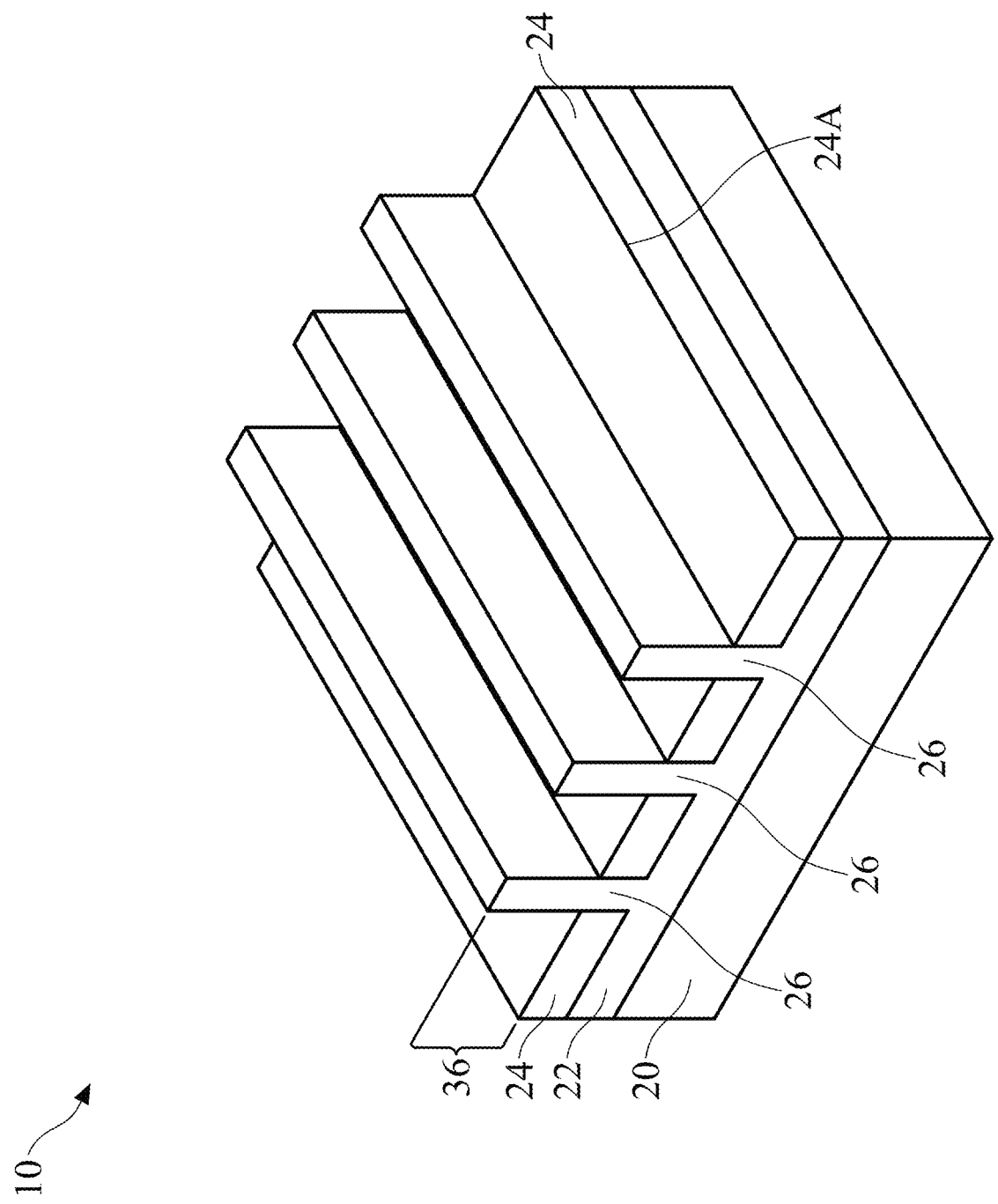

Referring to FIG. 3, STI regions 24 are recessed, so that the top portions of semiconductor strips 26 protrude higher than the top surfaces 24A of the remaining portions of STI regions 24 to form protruding fins 36. The respective process is illustrated as process 206 in the process flow 200 as shown in FIG. 23. The etching may be performed using a dry etching process, wherein HF$_3$ and NH$_3$, for example, are used as the etching gases. During the etching process, plasma may be generated. Argon may also be included. In accordance with alternative embodiments of the present disclosure, the recessing of STI regions 24 is performed using a wet etch process. The etching chemical may include HF, for example.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4:
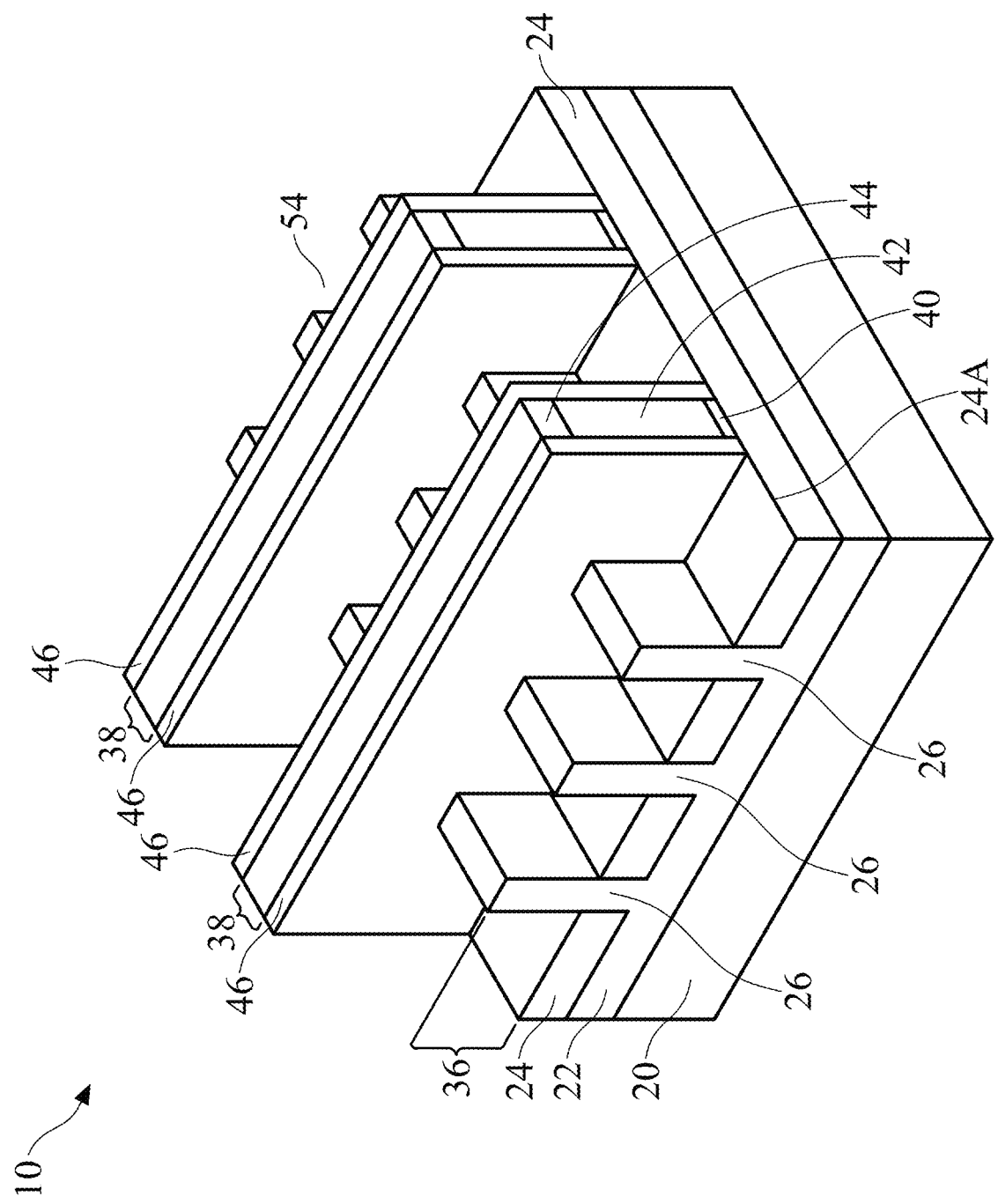

Referring to FIG. 4, dummy gate stacks 38 are formed to extend on the top surfaces and the sidewalls of (protruding) fins 36. The respective process is illustrated as process 208 in the process flow 200 as shown in FIG. 23. Dummy gate stacks 38 may include dummy gate dielectrics 40 and dummy gate electrodes 42 over dummy gate dielectrics 40. Dummy gate electrodes 42 may be formed, for example, using polysilicon, and other materials may also be used. Each of dummy gate stacks 38 may also include one (or a plurality of) hard mask layer 44 over dummy gate electrodes 42. Hard mask layers 44 may be formed of silicon nitride, silicon oxide, silicon carbo-nitride, or multi-layers thereof. Dummy gate stacks 38 may cross over a single one or a plurality of protruding fins 36 and/or STI regions 24.

Dummy gate stacks 38 also have lengthwise directions perpendicular to the lengthwise directions of protruding fins 36.

Next, gate spacers 46 are formed on the sidewalls of dummy gate stacks 38. The respective process is also shown as process 208 in the process flow 200 as shown in FIG. 23. In accordance with some embodiments of the present disclosure, gate spacers 46 are formed of a dielectric material(s) such as silicon nitride, silicon carbo-nitride, or the like, and may have a single-layer structure or a multi-layer structure including a plurality of dielectric layers.

Figure 5:
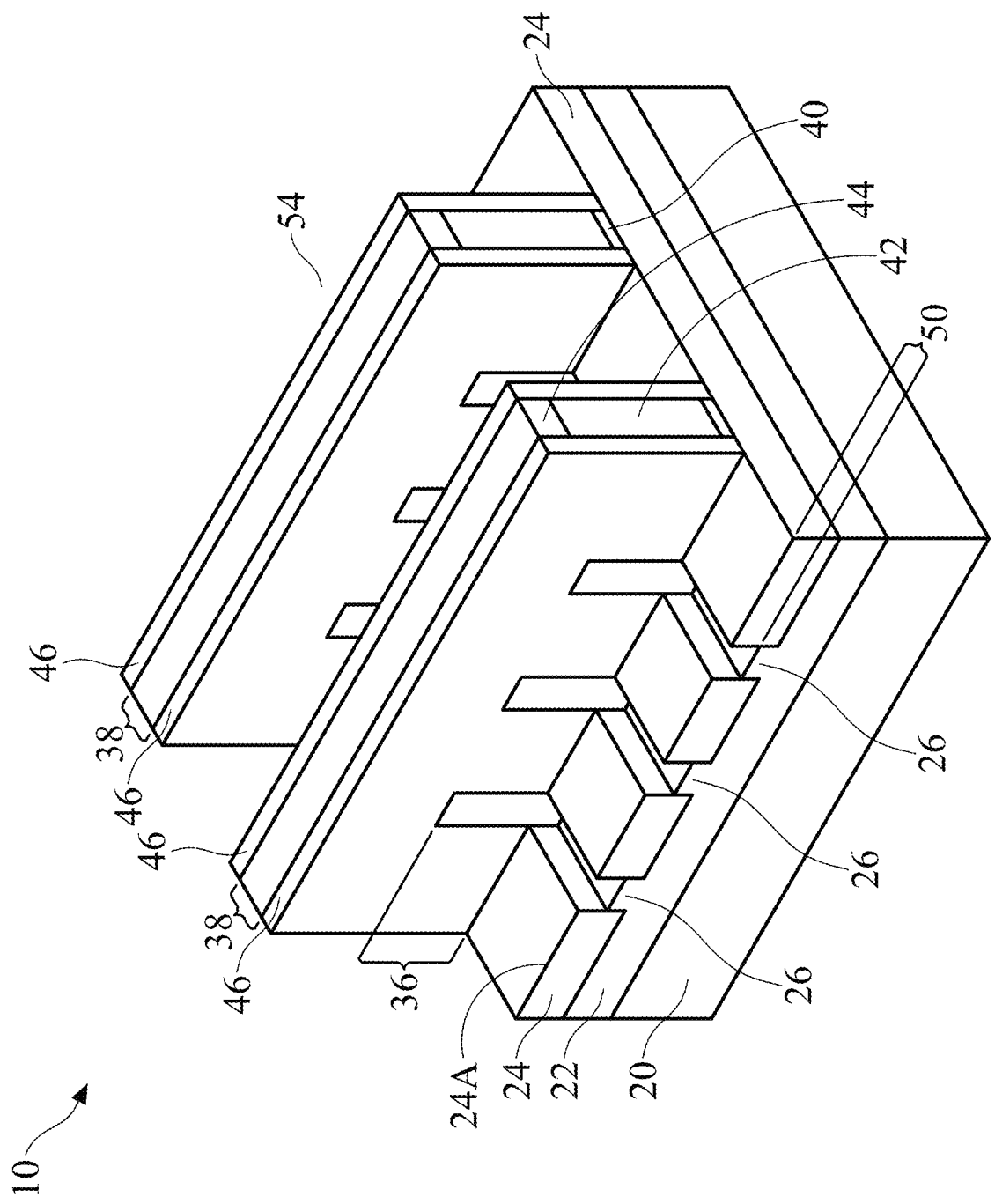

An etching process is then performed to etch the portions of protruding fins 36 that are not covered by dummy gate stacks 38 and gate spacers 46, resulting in the structure shown in FIG. 5. The respective process is illustrated as process 210 in the process flow 200 as shown in FIG. 23. The recessing may be anisotropic, and hence the portions of fins 36 directly underlying dummy gate stacks 38 and gate spacers 46 are protected, and are not etched. The top surfaces of the recessed semiconductor strips 26 may be lower than the top surfaces 24A of STI regions 24 in accordance with some embodiments. The spaces left by the etched protruding fins 36 are referred to as recesses 50. Recesses 50 comprise portions located between neighboring gate stack 38. Some lower portions of recesses 50 are between neighboring STI regions 24.

Figure 6:
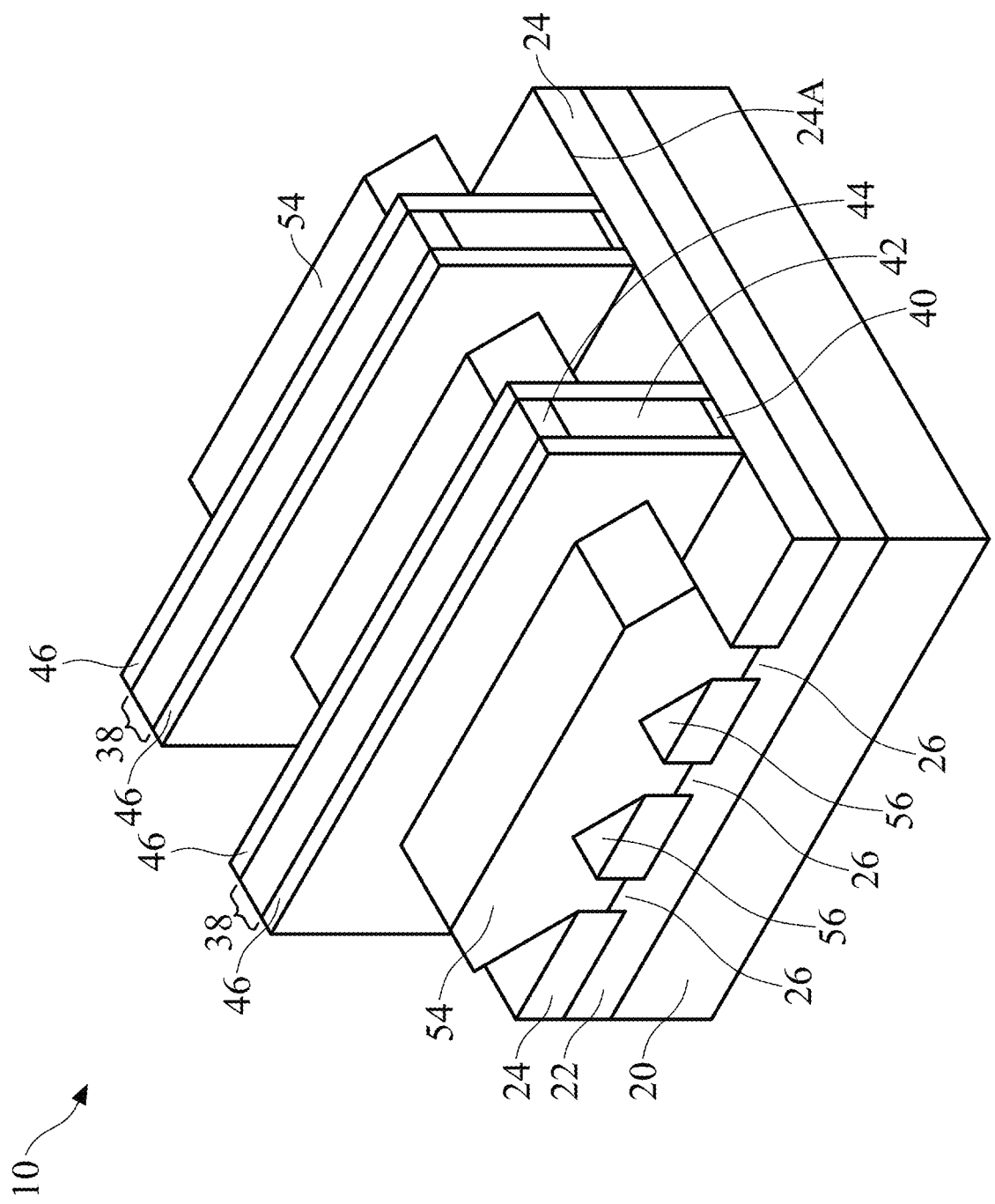

Next, epitaxy regions (source/drain regions) 54 are formed by selectively growing (through epitaxy) a semiconductor material in recesses 50, resulting in the structure in FIG. 6. The respective process is illustrated as process 212 in the process flow 200 as shown in FIG. 23. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB), silicon boron (SiB), or the like may be grown. Conversely, when the resulting FinFET is an n-type FinFET, silicon phosphorous (SiP), silicon carbon phosphorous (SiCP), or the like may be grown. In accordance with alternative embodiments of the present disclosure, epitaxy regions 54 comprise III-V compound semiconductors such as GaAs, InP, GaN, InGaAs, InAlAs, GaSb, AlSb, AlAs, AlP, GaP, combinations thereof, or multi-layers thereof. After Recesses 50 are filled with epitaxy regions 54, the further epitaxial growth of epitaxy regions 54 causes epitaxy regions 54 to expand horizontally, and facets may be formed. The further growth of epitaxy regions 54 may also cause neighboring epitaxy regions 54 to merge with each other. Voids (air gaps) 56 may be generated.

After the epitaxy step, epitaxy regions 54 may be further implanted with a p-type or an n-type impurity to form source and drain regions, which are also denoted using reference numeral 54. In accordance with alternative embodiments of the present disclosure, the implantation process is skipped when epitaxy regions 54 are in-situ doped with the p-type or n-type impurity during the epitaxy.

Figure 7:
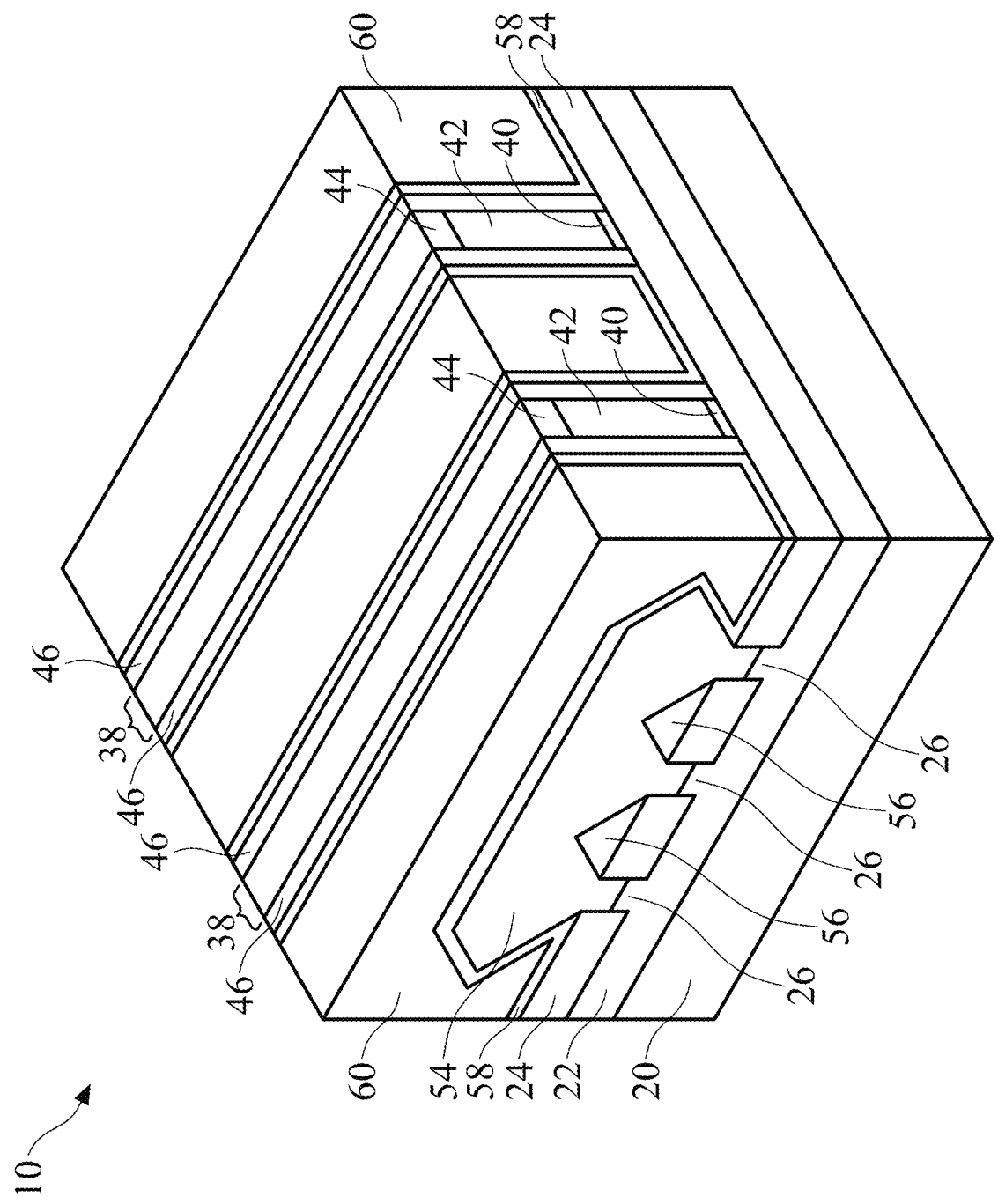

FIG. 7 illustrates a perspective view of the structure after the formation of Contact Etch Stop Layer (CESL) 58 and Inter-Layer Dielectric (ILD) 60. The respective process is illustrated as process 214 in the process flow 200 as shown in FIG. 23. CESL 58 may be formed of silicon oxide, silicon nitride, silicon carbo-nitride, or the like, and may be formed using CVD, ALD, or the like. ILD 60 may include a dielectric material formed using, for example, FCVD, spin-on coating, CVD, or another deposition method. ILD 60 may be formed of a dielectric material, which may include silicon oxide, Phospho-Silicate Glass (PSG), Boro-Silicate Glass (BSG), Boron-Doped Phospho-Silicate Glass (BPSG), or the like. A planarization process such as a CMP process or a mechanical grinding process may be performed to level the top surfaces of ILD 60, dummy gate stacks 38, and gate spacers 46 with each other.

Figure 8A:
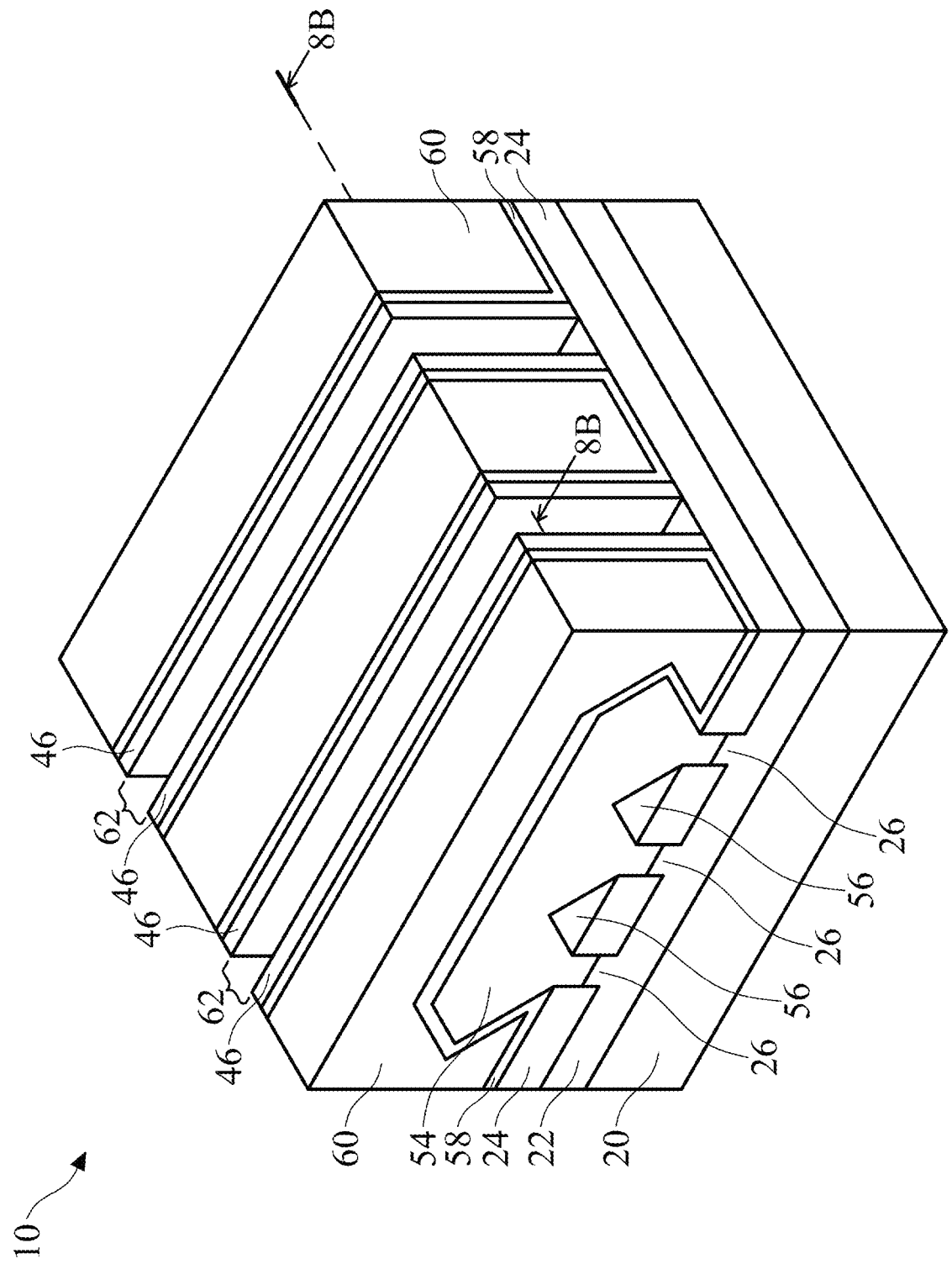
Figure 8B:
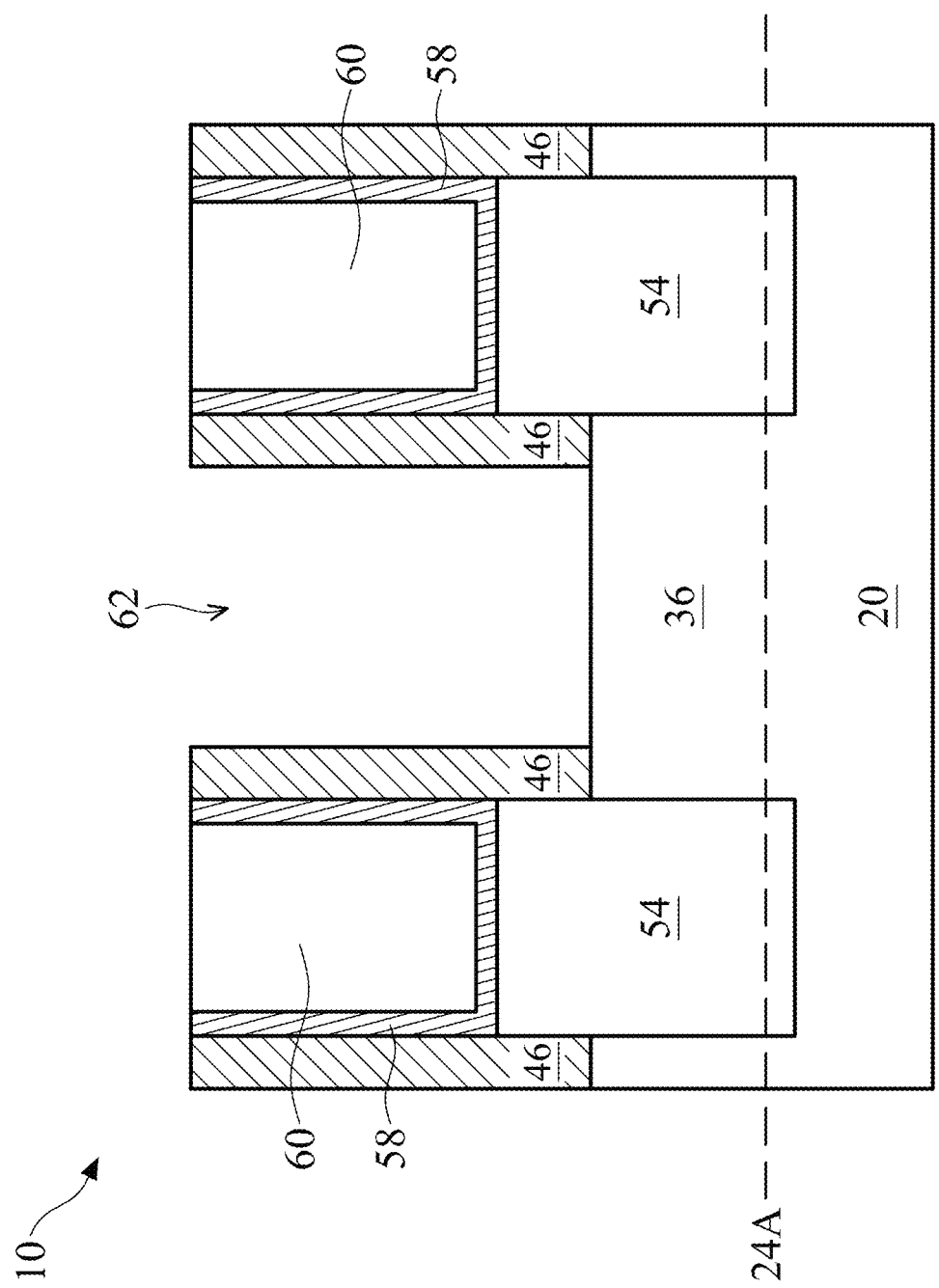
Figure 9:
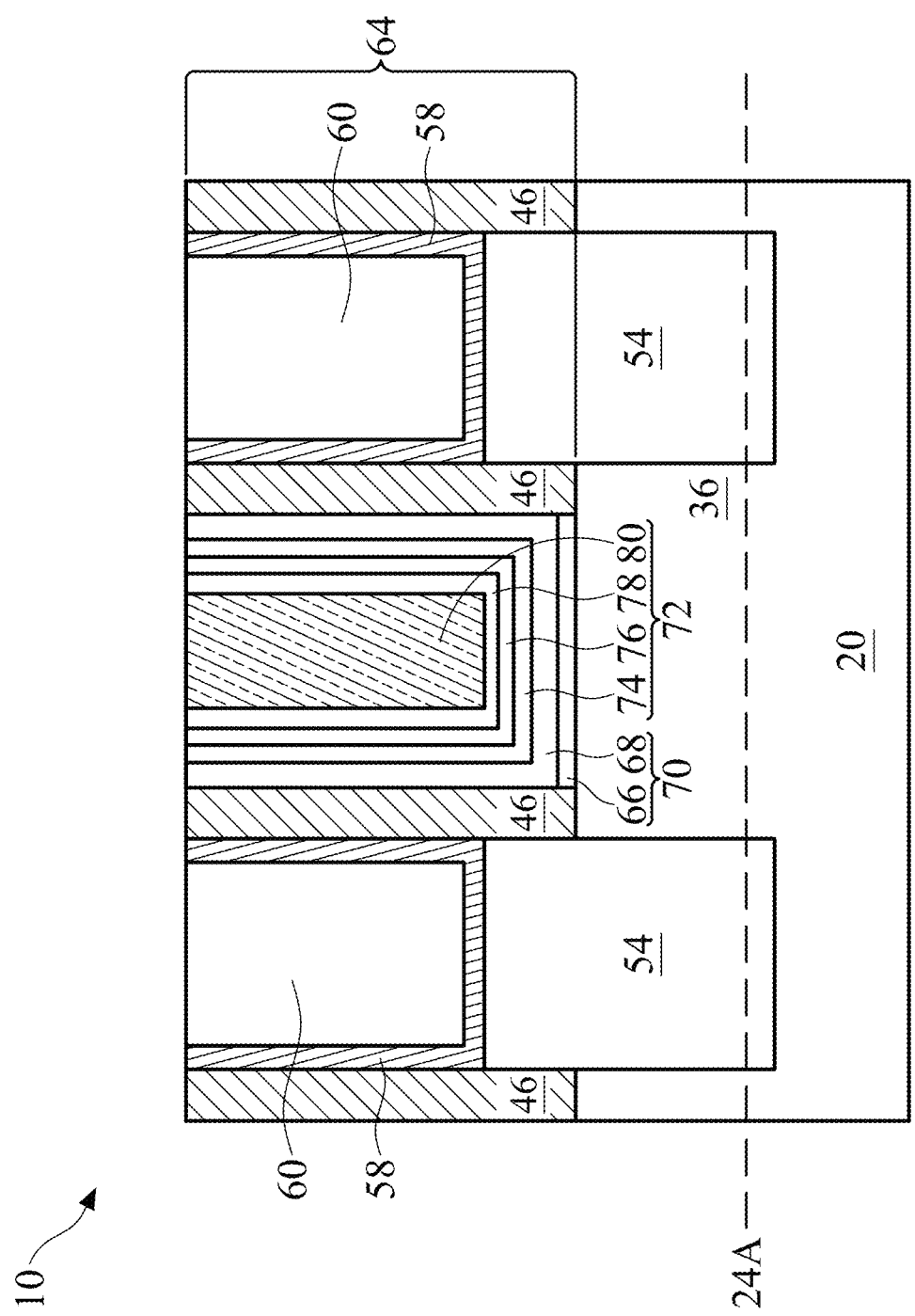

After the structure shown in FIG. 7 is formed, the dummy gate stacks 38 are replaced with replacement gates stacks, as shown in the processes in FIGS. 8A, 8B, and 9. In FIG. 8B, the top surface 24A of STI regions 24 are illustrated, and semiconductor fin 36 protrudes higher than top surface 24A.

To form the replacement gates, hard mask layers 44, dummy gate electrodes 42, and dummy gate dielectrics 40 as shown in FIG. 7 are removed, forming openings 62 as shown in FIG. 8A. The respective process is illustrated as process 216 in the process flow 200 as shown in FIG. 23. The top surfaces and the sidewalls of protruding fin 36 are exposed to openings 62, respectively.

FIG. 8B illustrates the reference cross-section 8B-8B as shown in FIG. 8A. Next, as shown in FIG. 9, replacement gate stack 64 is formed. The respective process is illustrated as process 218 in the process flow 200 as shown in FIG. 23. Gate stack 64 includes gate dielectric 70 and gate electrode 72. Gate dielectric 70 may include Interfacial Layer (IL) 66 and high-k dielectric layer 68. IL 66 is formed on the exposed surfaces of protruding fins 36, and may include an oxide layer such as a silicon oxide layer, which is formed through the thermal oxidation of protruding fins 36, a chemical oxidation process, or a deposition process. High-k dielectric layer 68 includes a high-k dielectric material such as hafnium oxide, lanthanum oxide, aluminum oxide, zirconium oxide, or the like. The dielectric constant (k-value) of the high-k dielectric material is higher than 3.9, and may be higher than about 7.0. In accordance with some embodiments of the present disclosure, high-k dielectric layer 68 is formed using ALD or CVD.

Referring further to FIG. 9, gate electrode 72 is formed on gate dielectric 70. Gate electrode 72 may include a diffusion barrier layer (a capping layer) 74 and one or more work function layer 76 over the diffusion barrier layer 74. Diffusion barrier layer 74 may be formed of titanium nitride, which may (or may not) be doped with silicon. Titanium nitride, when doped with silicon, is also sometimes referred to as titanium silicon nitride (Ti—Si—N, or TSN). Work function layer 76 determines the work function of the gate electrode, and includes at least one layer, or a plurality of layers formed of different materials. The specific material of the work function layer may be selected according to whether the respective FinFET is an n-type FinFET or a p-type FinFET. For example, when the FinFET is an n-type FinFET, work function layer 76 may include a TaN layer and a titanium aluminum (TiAl) layer over the TaN layer. When the FinFET is a p-type FinFET, work function layer 76 may include a TaN layer, a TiN layer over the TaN layer, and a TiAl layer over the TiN layer. After the deposition of the capping layer 74 and the work function layer 76, blocking layer 78, which may be another TiN layer, is formed. Blocking layer 78 may be formed using CVD.

Next, metal-filling region 80 is deposited, which has a bottom surface in physical contact with the top surface of blocking layer. The formation of metal-filling region 80 may be achieved through CVD, ALD, Physical Vapor Deposition (PVD), or the like, and metal-filling region 80 may be formed of or comprise cobalt, tungsten, alloys thereof, or other metal or metal alloys.

Figure 10:
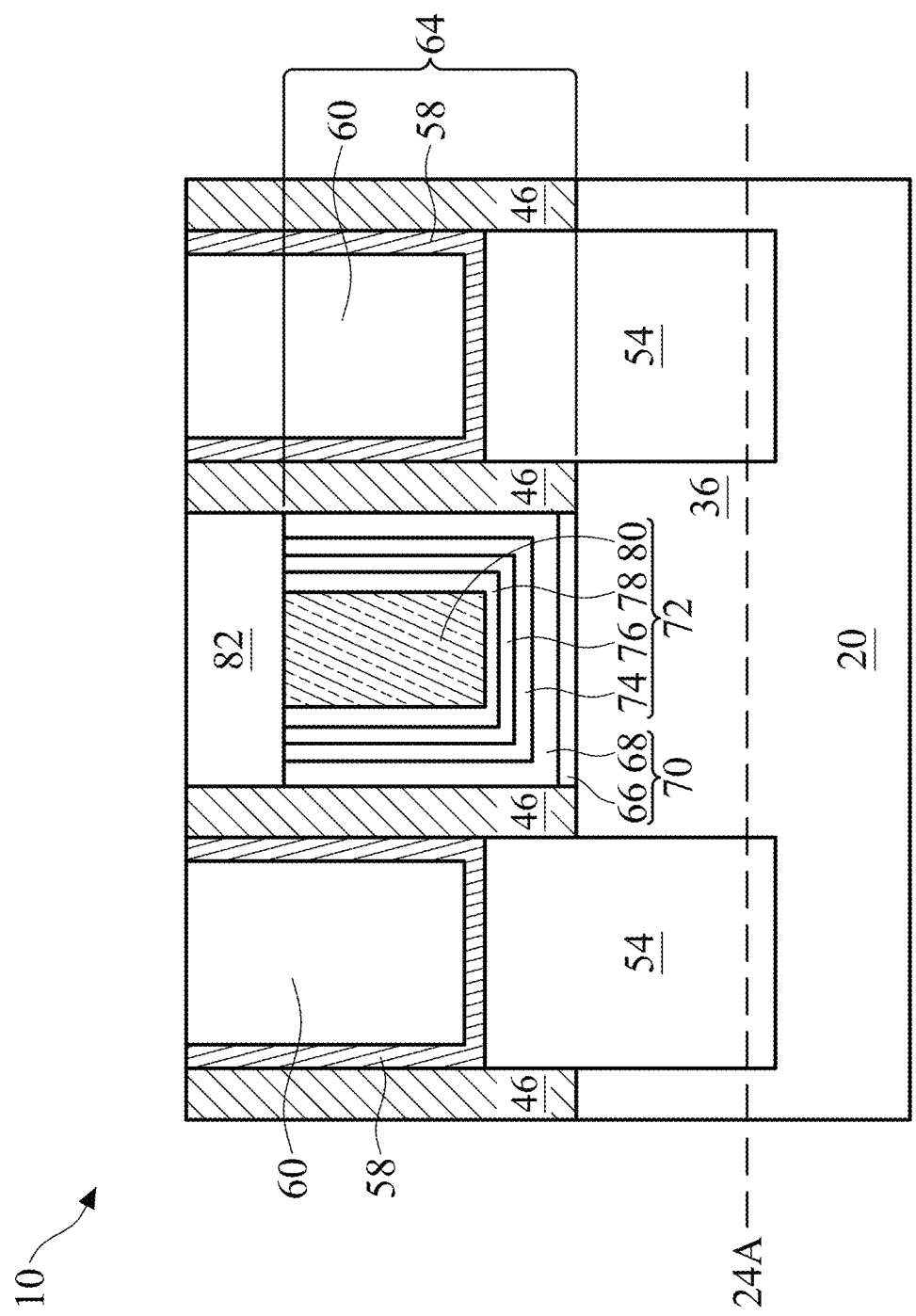

Next, a planarization such as a Chemical Mechanical Polish (CMP) process or a mechanical grinding process is performed, so that the top surface of gate stack 64 is coplanar with the top surface of ILD 60. In a subsequent process, gate stack 64 is etched back, resulting in a recess formed between opposite gate spacers 46. Next, as shown in FIG. 10, hard mask 82 is formed over replacement gate stack 64. In accordance with some embodiments of the present disclosure, the formation of hard mask 82 includes a deposition process to form a blanket dielectric material, and a planarization process to remove the excess dielectric material over gate spacers 46 and ILD 60. Hard mask 82 may be formed of silicon nitride, for example, or other like dielectric materials.

Figure 11A:
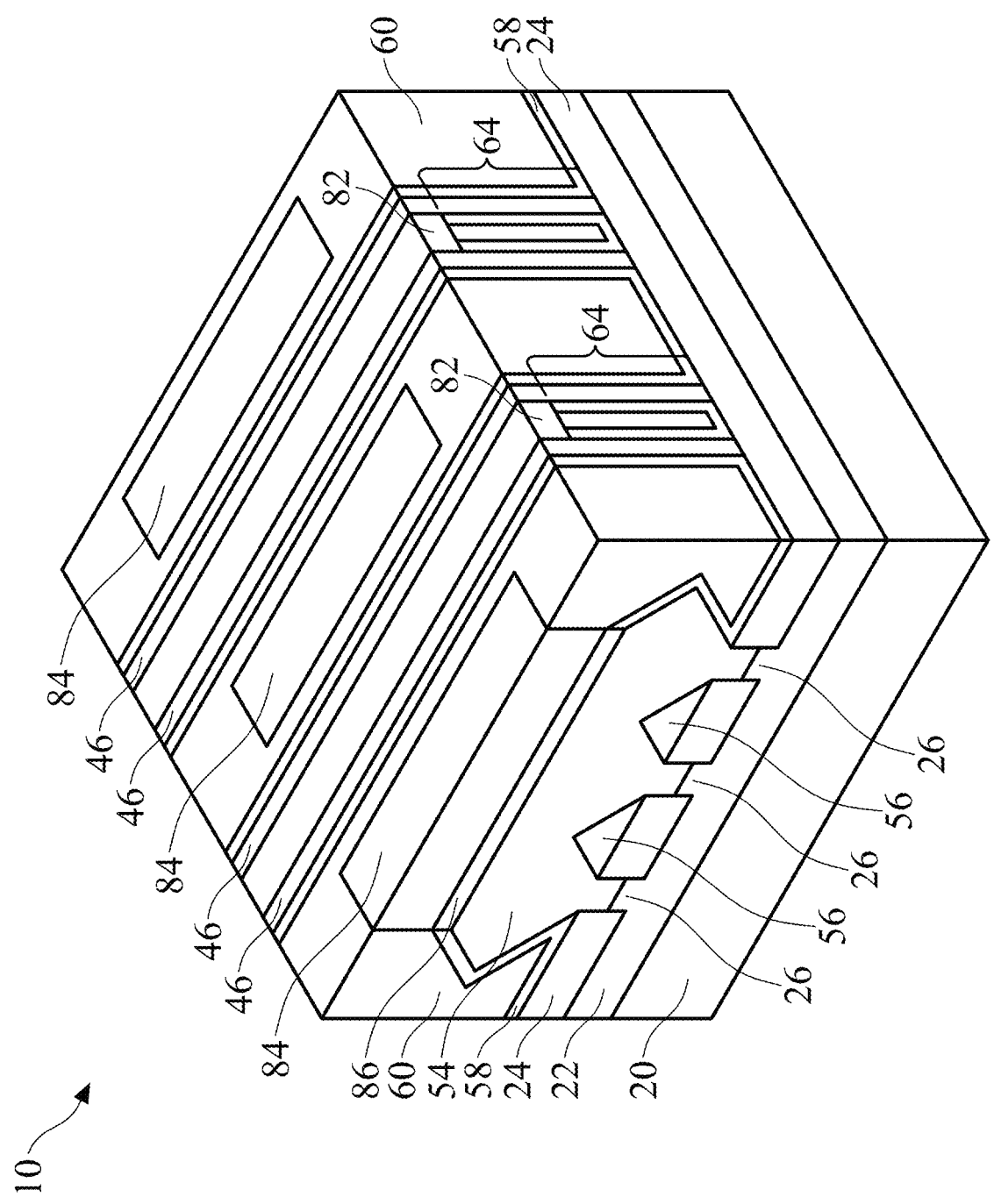
Figure 11B:
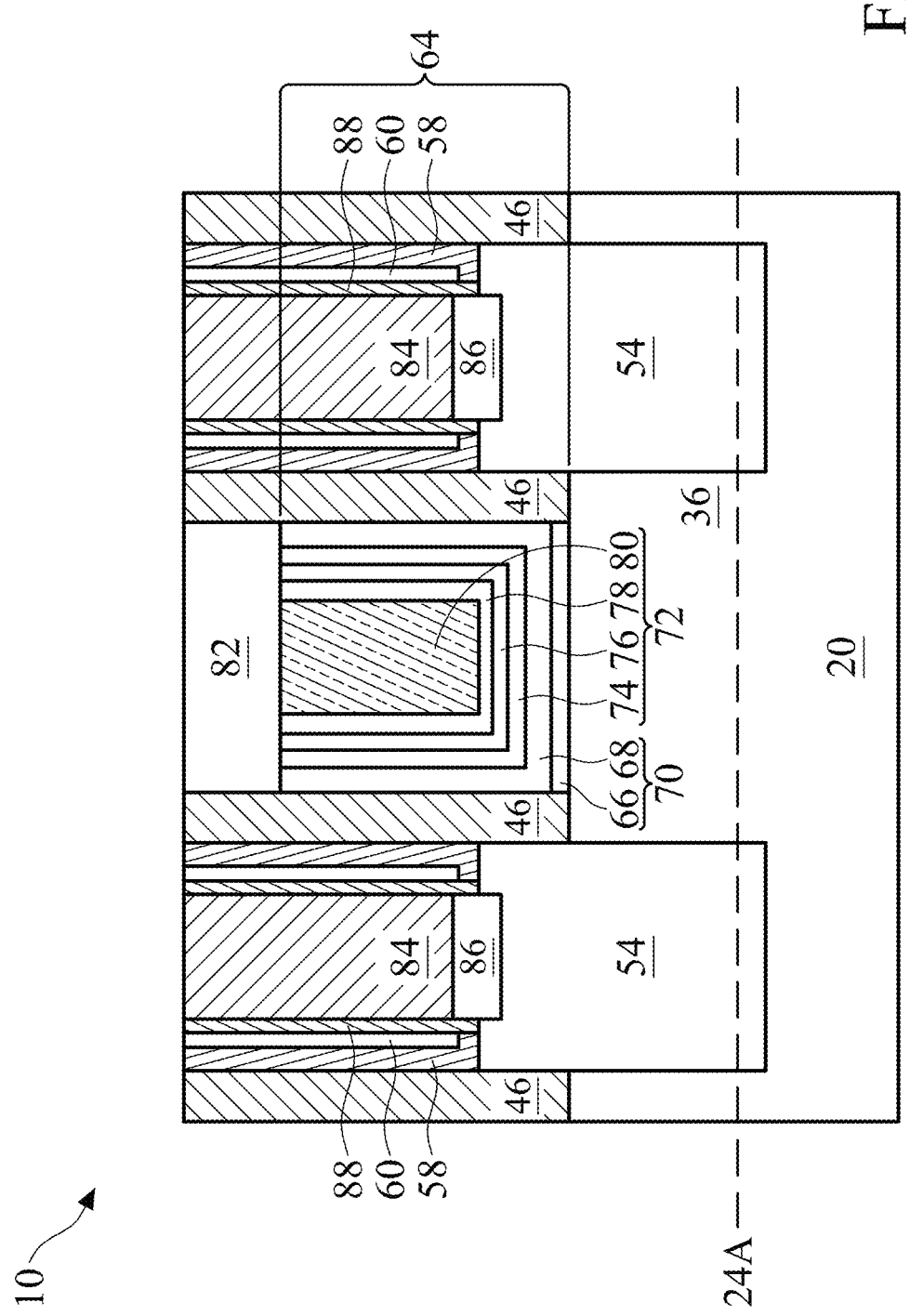

FIGS. 11A and 11B illustrate the formation of lower source/drain contact plugs 84 and silicide regions 86. The respective process is illustrated as process 220 in the process flow 200 as shown in FIG. 23. In accordance with some embodiments of the present disclosure, the formation process include etching ILD 60 and CESL 58 to form contact openings, depositing a metal layer (such as a titanium layer or a tantalum layer) extending into the contact openings, depositing a barrier layer 88 (such as a titanium nitride layer), and performing an anneal process, so that the bottom portion of the metal layer reacts with source/drain region 54 to form silicide regions 86. The remaining sidewall portions of the metal layer may be removed or left un-removed. Source/drain contact plugs 84 are then formed. Source/drain contact plugs 84 may be formed of or comprise cobalt, tungsten, other applicable metals, or the alloys thereof. A planarization such as a CMP process or a mechanical grinding process is performed to level the top surface of contact plug 84 with the top surface of ILD 60.

Figure 12:
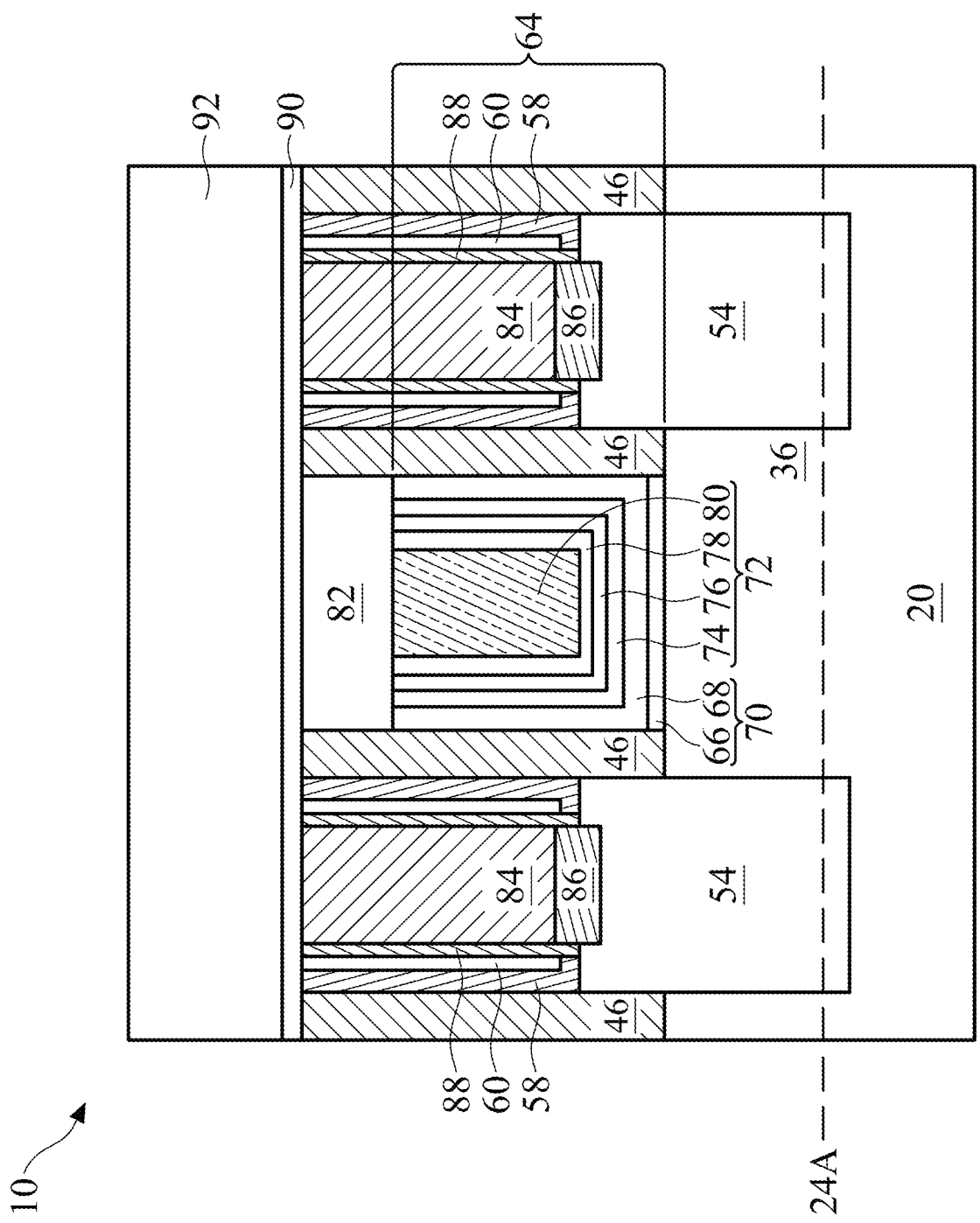

FIG. 12 illustrates the formation of Etch Stop Layer (ESL) 90 and dielectric layer 92 (which may also be an ILD) over ESL 90. The respective process is illustrated as process 222 in the process flow 200 as shown in FIG. 23. ESL 90 may be formed of or comprise silicon nitride, silicon carbon nitride, silicon carbon oxide, carbon nitride, the like, or a combination thereof. Dielectric layer 92 may comprise or be silicon dioxide, a low-k dielectric material, silicon oxynitride, PSG, BSG, BPSG, USG, FSG, OSG, SiOC, a spin-on glass, a spin-on polymer, or the like. ESL 90 and dielectric layer 92 may be deposited by using spin-on coating, CVD, ALD, LPCVD, Plasma Enhance Chemical Vapor Deposition (PECVD) or the like.

Figure 13:
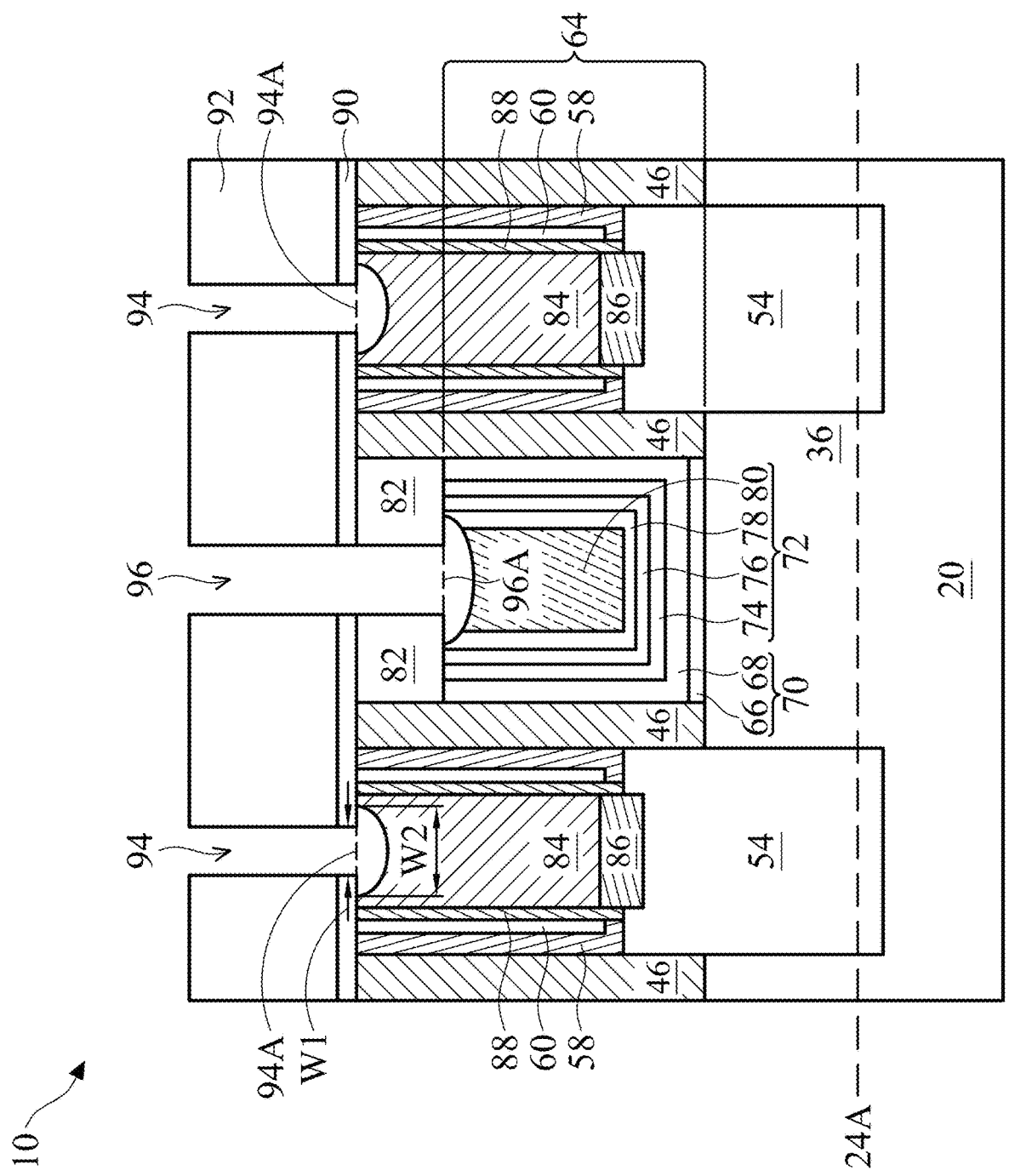

FIG. 13 illustrates the formation of openings 94 and 96 through etching to reveal contact plugs 84 and gate electrode 72, respectively. The respective process is illustrated as process 224 in the process flow 200 as shown in FIG. 23. Dielectric layer 92 and ESL 90 may be etched, for example, using photolithography and one or more etch processes. The etch process may include a dry etch process using Reactive Ion Etch (RIE), Neutral Beam Etch (NBE), Inductively Coupled Plasma (ICP) etch, Capacitively Coupled Plasma (ICP) etch, Ion Beam Etch (IBE), the like, or a combination thereof. The etch process may be anisotropic. In some examples, the etching process includes a plasma using a first gas comprising one or more of carbon fluoride such as $CF_4$, $CHF_3$, $CH_2F_2$, $CH_3F$, the like, or a combination thereof. Other gases such as $N_2$, $H_2$, argon, or the like, may be added. The pressure in the respective etching chamber may be in a range between about 0.1 mTorr and about 100 mTorr. The power of the plasma generator for the etching may be in a range between about 30 Watts and about 5,000 Watts. A substrate bias voltage of the etch can be in a range between about 10 kV and about 100 kV and with a duty cycle in a range between about 5% and about 95%.

In accordance with some embodiments, as shown in FIG. 13, the etching process includes a main etching process to etch through dielectric layer 92 and ESL 90, so that contact plugs 84 and gate electrode 72 are exposed. In accordance with some embodiments, an over-etch process is performed, with the over-etch process has more isotropic effect than the main etch process (for example, by applying a smaller bias voltage than the main etch). The widths W2 of the portions of openings 94 and 96 in contact plugs 84 and gate electrode 72, respectively, are greater than the widths W1 of the respective overlying portions of openings 94 and 96 in dielectric layer 92 and ESL 90. For example, the ratio W2/W1 may be greater than about 1.2, or may be in the range between about 1.2 and about 2.0. In accordance with alternative embodiments, the formation of openings 94 and 96 is stopped when ESL 90 is etched-through, and no over-etch is performed. The bottom surface of the respective openings 94 and 96 are thus shown with dashed lines 94A and 96A. Depending on the process conditions of the over-etch process and how long the over-etch process lasts, opening 96 may expand into, and stop in, any of regions 80, 78, 76, and 74 in gate electrode 72.

Figure 14:
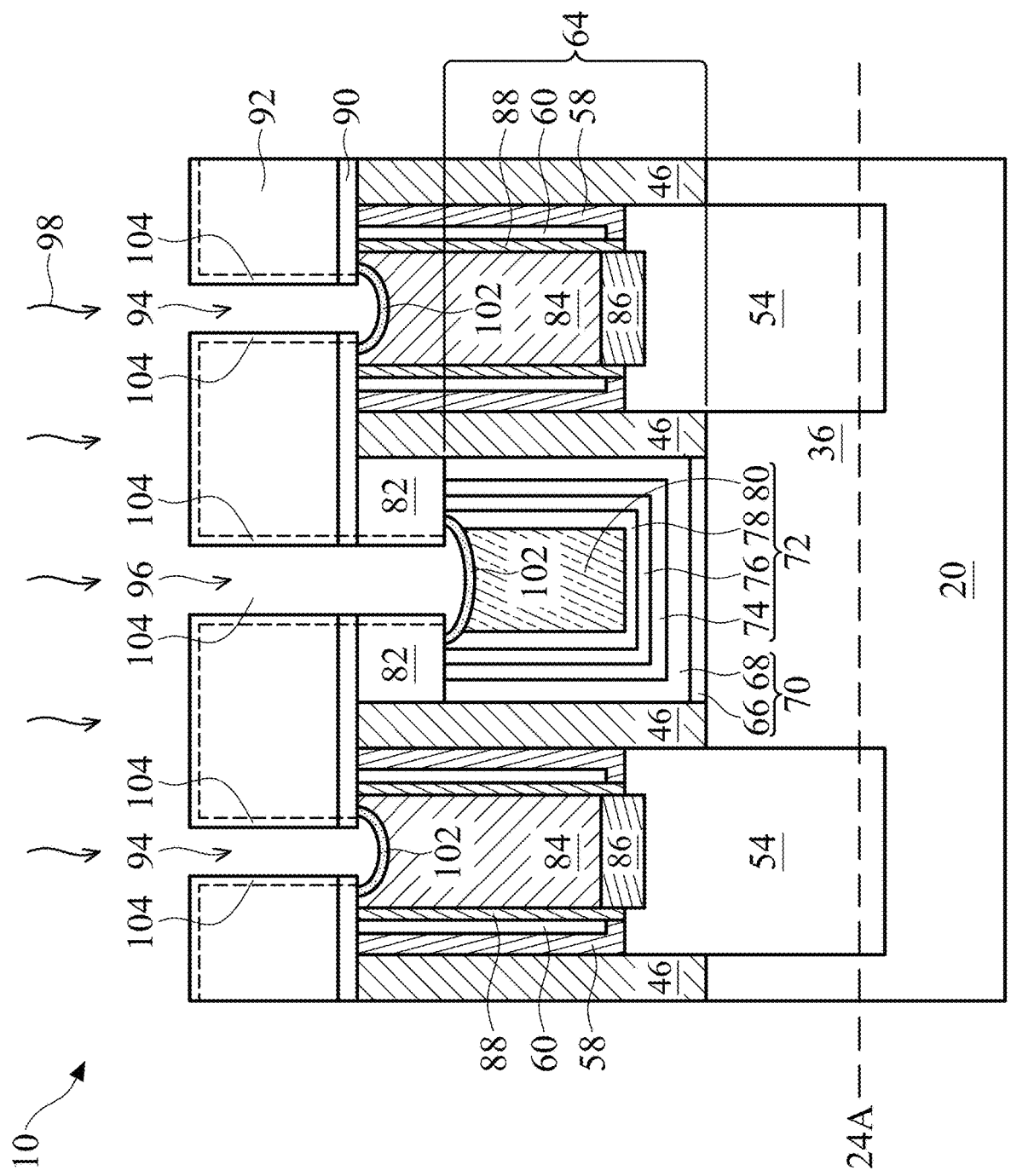

Referring to FIG. 14, a first treatment 98 is performed. The respective process is illustrated as process 226 in the process flow 200 as shown in FIG. 23. Carrier gas such as argon may be added. In accordance with some embodiments, the first treatment 98 is a plasma treatment performed using oxygen ($O_2$). The flow rate of oxygen may be in the range between about 1,000 sccm and about 9,000 sccm. The temperature of wafer 10 may be in the range between about room temperature (for example, about 21° C.) and about 200° C. The duration of the plasma treatment may be in the range between about 10 seconds and about 300 seconds. The power for generating the plasma may be in the range between about 1,000 watts and about 4,000 watts, which may be generated using ICP or CCP. The pressure in the respective chamber may be in the range between about 20 mTorr and about 1,000 mTorr.

In accordance with alternative embodiments, the first treatment 98 is a thermal treatment performed using oxygen ($O_2$), with plasma being turned off, and with the temperature of wafer 10 being elevated. The flow rate of oxygen may be in the range between about 1 SLM and about 20 SLM. The temperature of wafer 10 may be in the range between about 100° C. and about 400° C. The duration of the thermal treatment may be in the range between about 10 seconds and about 300 seconds. The pressure in the respective chamber may be in the range between about 10 Torr and about 100 Torr.

During the first treatment, a surface layer of each of the exposed contact plugs 84 and gate electrode 72 is oxidized, resulting in metal oxide layers 102 (formed of or comprising tungsten oxide, cobalt oxide, or the like). The metal oxide layer 102 in opening 96 may include the oxide of layers 74, 76, 78, and 80, etc., depending on the size of opening 96. During the etching process (FIG. 13) for forming openings 94 and 96, some undesirable elements may be introduced and attached to the exposed surfaces of contact plugs 84 and gate electrode 72. The undesirable elements may be introduced by the etching gases, and may include carbon, fluorine, nitrogen, or the like, or combinations thereof. These elements cause the surfaces of the exposed contact plugs 84 and gate electrode 72 to be non-uniform. The first treatment may break the bonds of these elements from the underlying contact plugs 84 and gate electrode 72, so that these undesirable elements may be removed in subsequent processes.

Furthermore, in the etching process (FIG. 13), the surface layers of dielectric layer 92 may lose oxygen atoms. For example, when dielectric layer 92 is formed of or comprise silicon oxide, before the etching process, dielectric layer 92 may have a Si:O ratio close to about 1:2. The etching process may cause the Si:O ratio to increase to, for example, about 1:1.5 (or higher or lower), wherein the Si:O ratio is atomic ratio. The first treatment may cause the Si:O ratio in surface layer 104 (FIG. 14) of dielectric layer 92 and ESL 90 to reduce again. Throughout the description, layer 104 is referred to as a passivated layer of dielectric layer 92 and ESL 90. For example, the Si:O ratio of the surface layer 104 may be reduced to about 1:2.0. It is appreciated that the inner portions of dielectric layer 92 close to (and contacting) passivated layer 104 have a Si:O ratio higher than the Si:O ratio in passivated layer 104. For example, the Si:O ratio in the inner portion of dielectric layer 92 may be in the range between about 1:1.4 and about 1:1.8.

Figure 15:
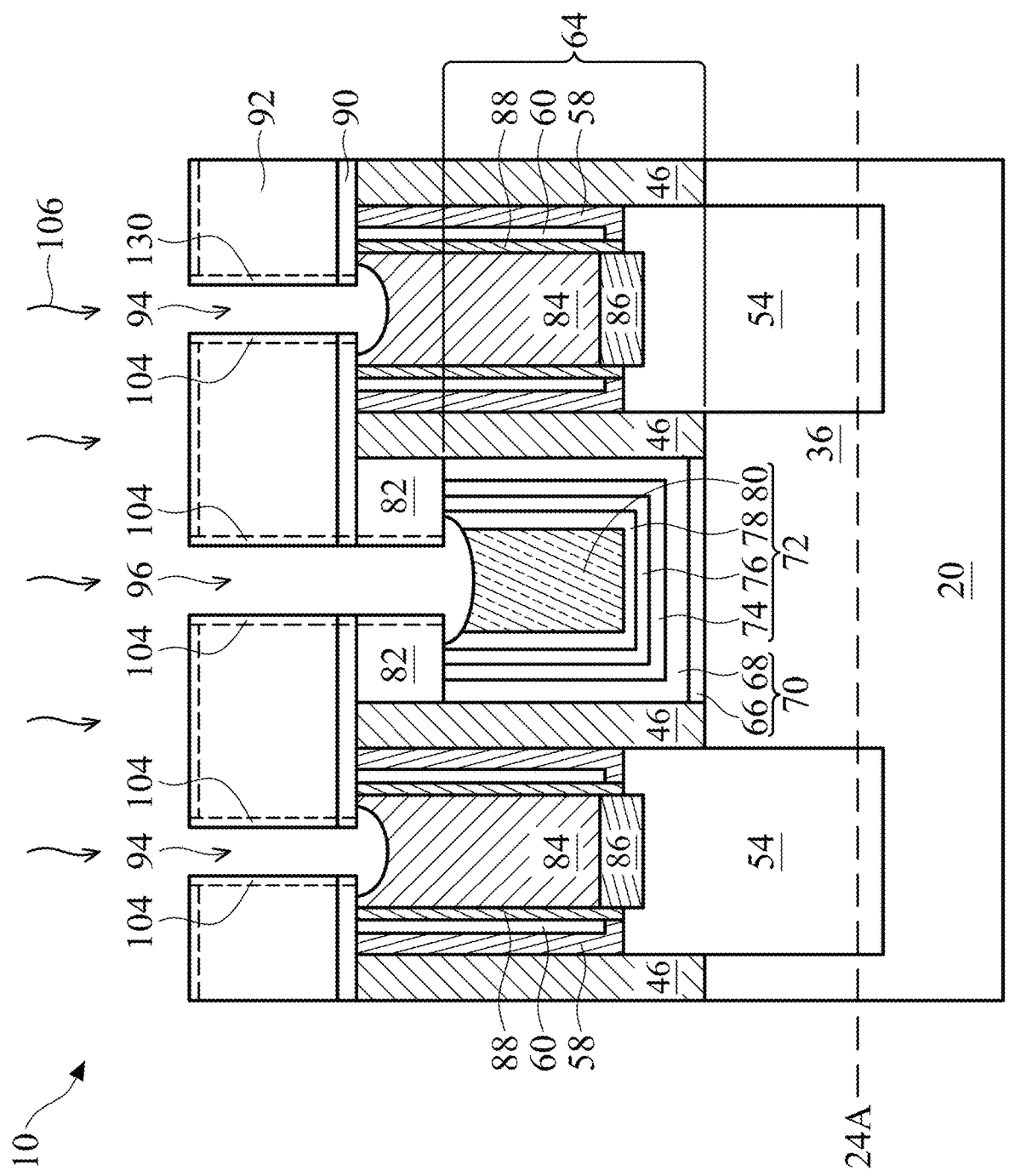

Referring to FIG. 15, a second treatment 106 is performed. The second treatment 106 may include a reduction reaction performed on oxide layers 102. The respective process is illustrated as process 228 in the process flow 200 as shown in FIG. 23. In accordance with some embodiments, the second treatment 106 includes a plasma treatment performed using hydrogen ($H_2$), with plasma being turned on. Carrier gas such as argon may be added. In accordance with some embodiments, the flow rate of hydrogen is in the range between about 1,000 sccm and about 6,000 sccm. The temperature of wafer 10 may be in the range between 100° C. and about 400° C. The duration of the second treatment may be in the range between about 10 seconds and about 360 seconds. The power for generating the plasma may be in the range between about 1,000 watts and about 4,000 watts, which may be generated using CCP, for example. The pressure in the respective chamber may be in the range between about 3 Torr and about 45 Torr.

The second treatment results in the metal oxide layers 102 to lose oxygen, and hence elemental metals (such as tungsten or cobalt) are generated by the reduction reaction. In addition, the undesirable elements such as carbon, fluorine, and nitrogen introduced by the etching process are also removed. As a result, the surface conditions of contact plugs 84 and gate electrode 72 are more uniform through the first and the second treatments.

Figure 16:
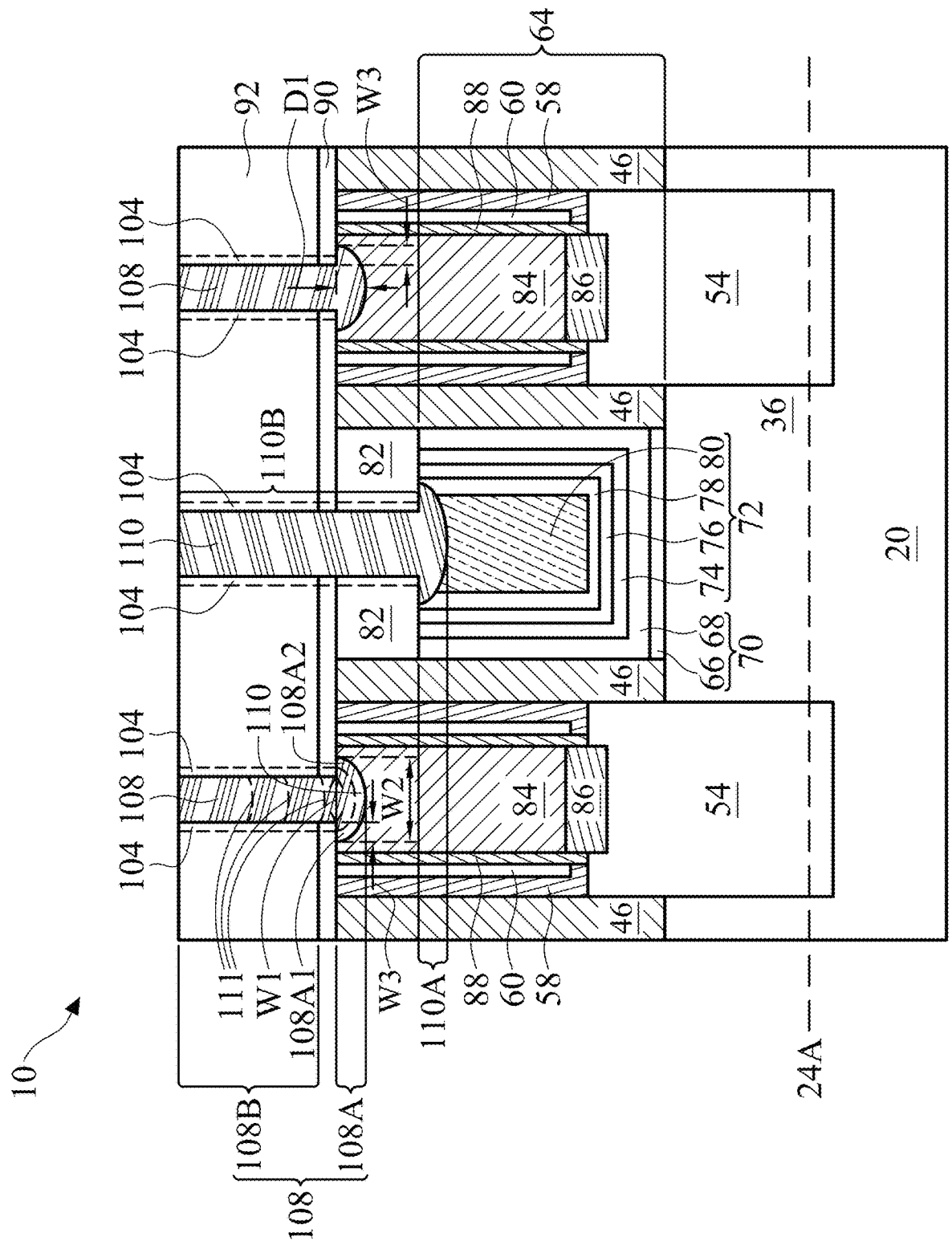

FIG. 16 illustrates a bottom-up deposition process for forming (upper) source/drain contact plugs 108 and gate contact plug 110. The respective process is illustrated as process 230 in the process flow 200 as shown in FIG. 23. In accordance with some embodiments, the bottom-up deposition process is performed using a thermal CVD process. It is believed that a thermal CVD process may provide thermal energy to assist forming nucleation sites for forming contact plug 108 and gate contact plug 110. In accordance with some embodiments, no plasma is generated in the bottom-up deposition process. The bottom-up deposition process may be performed using $WF_6$ and $H_2$ as process gases (when tungsten is to be grown). In accordance with some embodiments, the bottom-up deposition process is performed with the flow rate of hydrogen being in the range between about 1,000 sccm and about 7,000 sccm, and the flow rate of $WF_6$ being in the range between about 50 sccm and about 450 sccm. The temperature of wafer 10 may be in the range between 200° C. and about 400° C. The pressure in the respective chamber may be in the range between about 10 Torr and about 300 Torr.

The thermal energy provided from the thermal CVD process may promote incubation of the nucleation sites at a relatively long period of time. As the deposition rate is controlled at a relatively low deposition rate, such as less than 15 Å per second, the slow growing process allows the nucleation sites to slowly grow. The low deposition rate may be controlled by supplying a deposition gas mixture with a relatively low metal precursor ratio in a hydrogen dilution gas mixture, which will be described detail below. The nucleation sites are prone to form at certain locations of the substrate having similar material properties to the nucleation sites. For example, as the nucleation sites include metal materials, the nucleation sites are then prone to adhere and nucleate on contact plugs 84 and gate electrode 72. Once the nucleation sites are formed at the selected locations, the elements/atoms may then continue to adhere and anchor on the nucleation sites, piling up the elements/atoms at the selected locations, so that a selective deposition process, as well as bottom-up deposition process, is achieved. The nucleation sites are selectively incubated on the exposed surfaces of contact plugs 84 and gate electrode 72, so that source/drain contact plugs 108 and gate contact plug 110 may grow vertically from the bottom upward to fill openings 94 and 96. Dashed lines 111 schematically illustrate the top surfaces of contact pugs 108 and 110 when the bottom-up deposition process proceeds.

The deposited material may include tungsten or a tungsten alloy. Alternatively, other metal that may form a selected phase (discussed in subsequent paragraphs) may also be used to form contact plugs 108 and 110.

As shown in FIG. 16, contact plugs 108 and 110 may have a bottom portion having a substantially rounded and/or convex structure 108A and 110A filling the concave spaces in contact plugs 84 and gate electrode 72, respectively. The convex structure 108A and 110A extend laterally and outward below ESL 90 and the below the top (e.g., horizontal) surface of ILD 60. The convex structures 108A and 110A may have depth Di greater than 15 Å, such as in a range between about 20 Å and about 100 Å, and more particularly, such as in the range between about 30 Å and about 50 Å, although other depths may be achieved. Convex structures 108A include tip portions 108A1 and 108A2 directly underlying dielectric layer 92. The tip portions 108A1 and 108A2 are in direct contact with the bottom surface of ESL 90, and may have width W3 in a range between about 1 nm and about 5 nm. The convex structure results in an increased interface between contact plugs 108/110 and the respective underlying contact plugs 84 and gate electrode 72, hence the reduction in the contact resistance. Furthermore, the better interface management provided by the convex structure and the tip portions may also prevent the contact plugs 108 and 110 from undesirably pulling back at the subsequent CMP process.

Through the bottom-up deposition process, the deposited metallic material is grown to a level higher than the top surfaces of dielectric layer 92. The excess material may be removed in a planarization process, such as a CMP process or a mechanical grinding process. As a result, the top surface of contact plugs 108 and 110 are coplanar with the top surface of dielectric layer 92. The top horizontal portions of passivated layer 104 may be, or may not be, removed by the planarization process.

The contact plugs 108 and 110 are free from barrier layers (that are formed of titanium nitride, tantalum nitride, or the like). Rather, an entirety of the contact plug 108 and an entirety of the contact plug 110 may be formed of a homogeneous material, with different portions of contact plugs 108 and 110 having same elements and same atomic percentage of the elements. Conventional barrier layers cause significant increase in the resistance of contact plugs. Furthermore, with the increasing narrower contact plugs to be formed, the resistance of the contact plugs increase exponentially. Accordingly, by not forming the barrier layers, the resistance of contact plugs may be significantly reduced.

Figure 17:
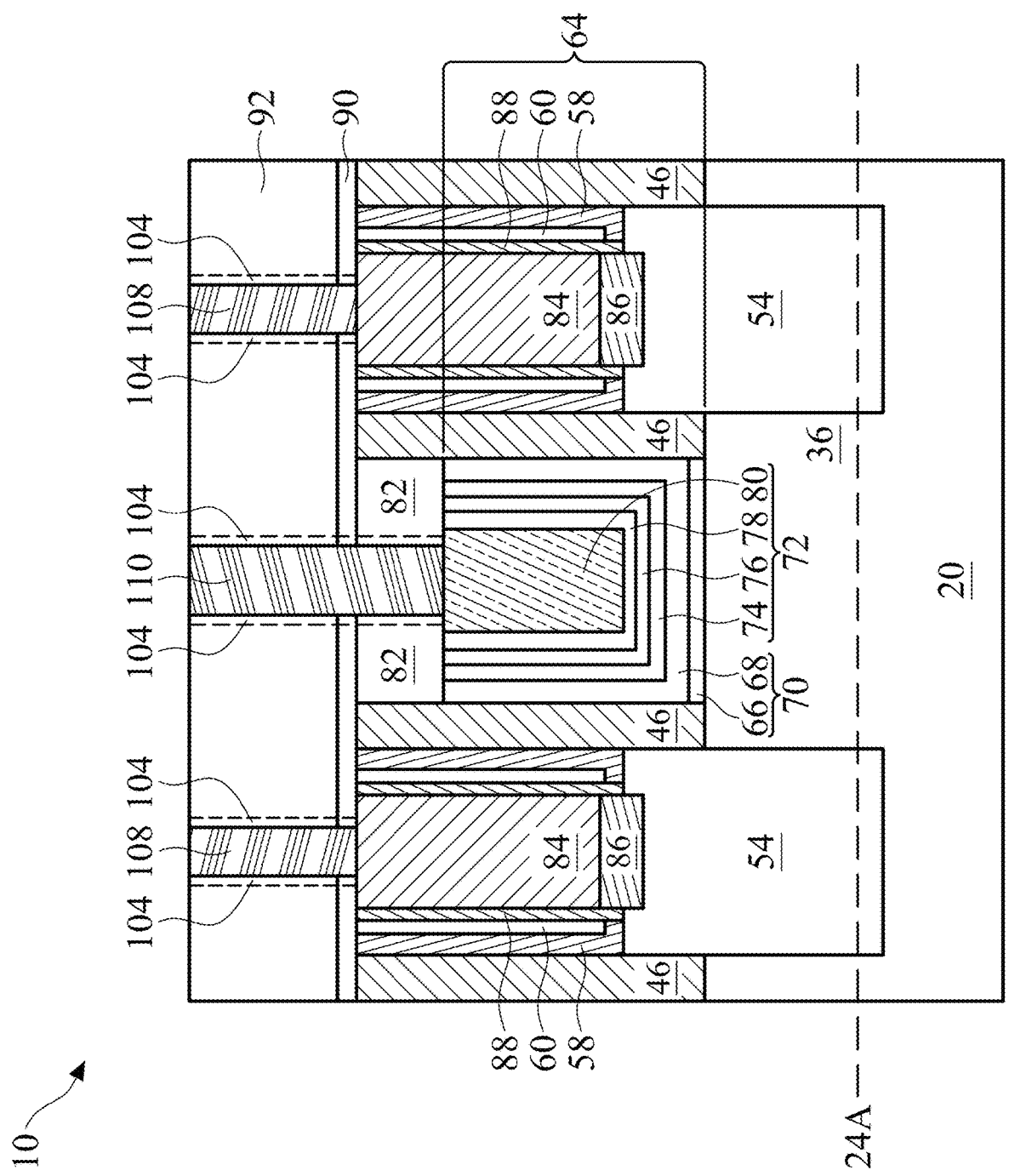
FIG. 17 illustrates a cross-sectional view of a FinFET and contact plugs in accordance with some embodiments.

FIG. 17 illustrates a structure formed in accordance with alternative embodiments. The formation processes for forming this structure are essentially the same as that for forming the structure shown in FIG. 16, except that the bottoms of openings 94 and 96 are at the positions marked as 94A and 96A as shown in FIG. 13 due to the lack of over-etch. The rest of the processes are essentially the same as in the previous embodiments. In the resulting structure, as shown in FIG. 17, the bottom parts of contact plugs 108 and 110 do not extend laterally to be directly under ESL 90.

Figure 22:
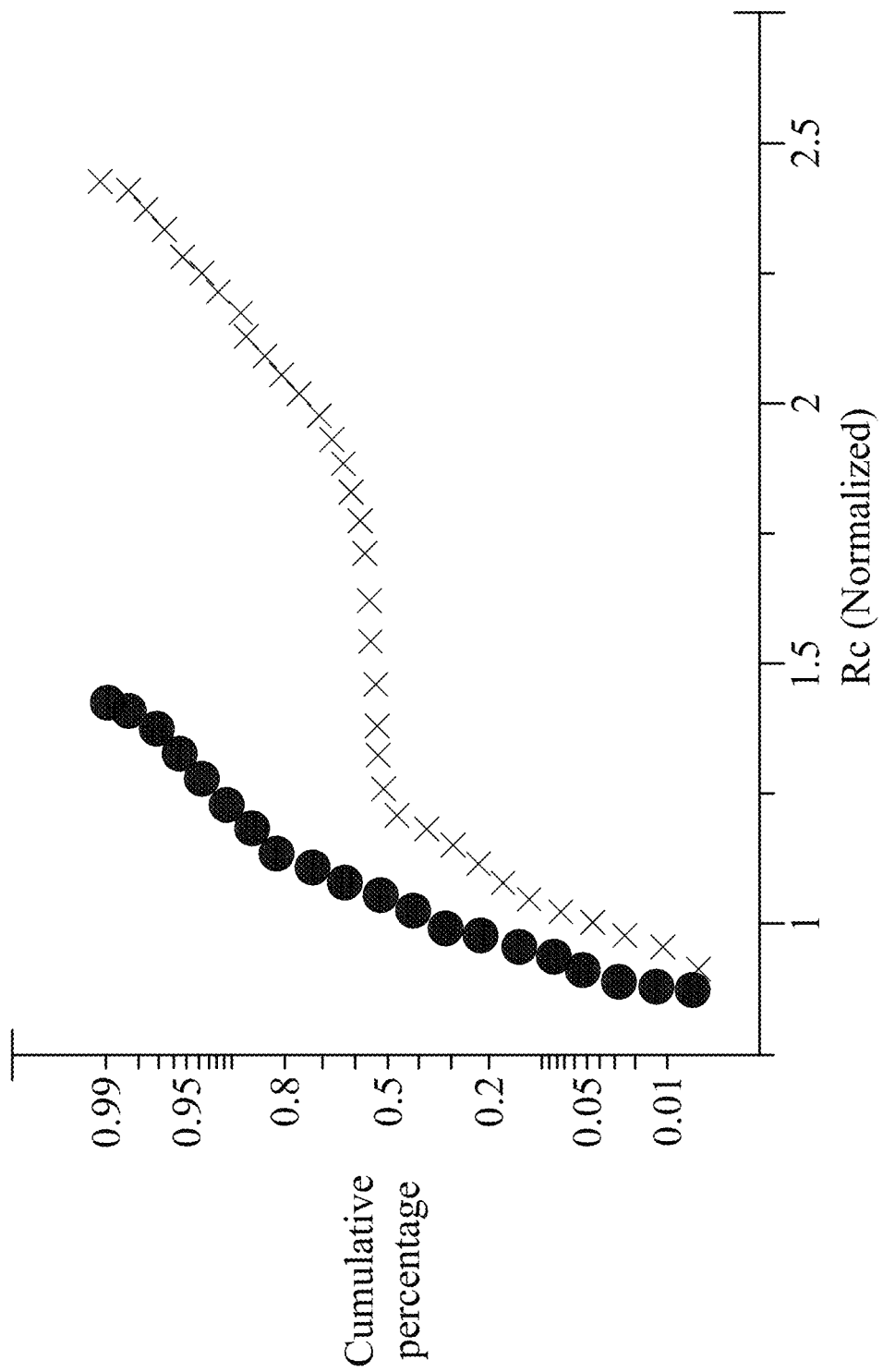
FIG. 22 illustrates the results showing the cumulative percentages of contact resistance values as a function of normalized contact resistance values in accordance with some embodiments.

Tungsten contact plugs may have two phases, alpha phase and beta phase. The corresponding tungsten is referred to as $\alpha$-phase tungsten ($\alpha$-W) and $\beta$-phase tungsten ($\beta$-W), respectively. The resistivity of $\beta$-W is much higher (sometimes six times higher) than the resistivity of $\alpha$-W. If the first and the second treatments are not performed, the phase of the formed tungsten contact plugs is random, and cannot be controlled. This results in the resistance of the resulting tungsten contact plugs to vary significantly from contact plug to contact plug, and the performance of the resulting devices and circuits cannot be controlled. In accordance with some embodiments of the present disclosure, by performing the treatments prior to the deposition of contact plugs, passivation layer 104 is formed, and is more oxygen rich than the surface layer when no treatments are performed. This makes the formed contact plugs 108 and 110 to be more likely to be $\alpha$-W. Furthermore, the removal of the undesirable elements (such as F, C, and N) through the treatments makes the environment for the tungsten growth to be more uniform throughout wafer 10, and hence most (for example, more than 99 percent) of the contact plugs are formed as including $\alpha$-W. The device performance through the wafer 10 and the dies therein are thus more uniform, as shown in FIG. 22, which is discussed in a subsequent paragraph. Also, with $\alpha$-W being formed, the resistance values of the contact plugs are low.

FIG. 22 illustrates experiment results, wherein cumulative percentages of contact resistance values are shown as a function of normalized contact resistance values. The solid circles are the results of the samples in accordance with the embodiments of the present disclosure. The crosses are the results of the samples of tungsten plugs (having no barrier), except no treatments are performed prior to the deposition of tungsten. FIG. 22 indicates that with the treatments performed, the contact resistance values of a plurality of contact plugs throughout a wafer are much more uniform than if the treatments are not performed.

Figure 18:
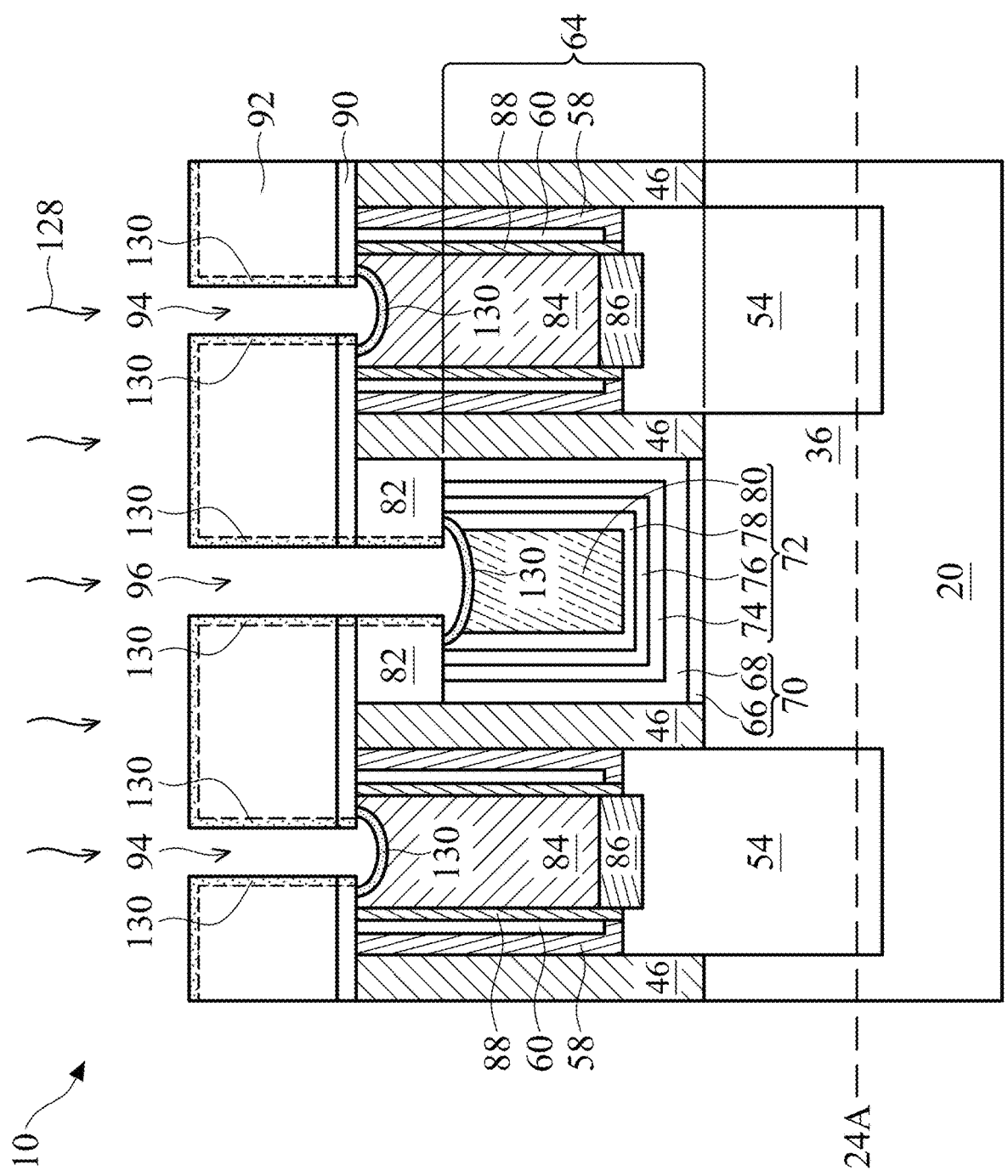
FIGS. 18 through 20 illustrate the perspective views and cross-sectional views of intermediate stages in the formation of FinFETs and contact plugs in accordance with some embodiments.
Figure 19:
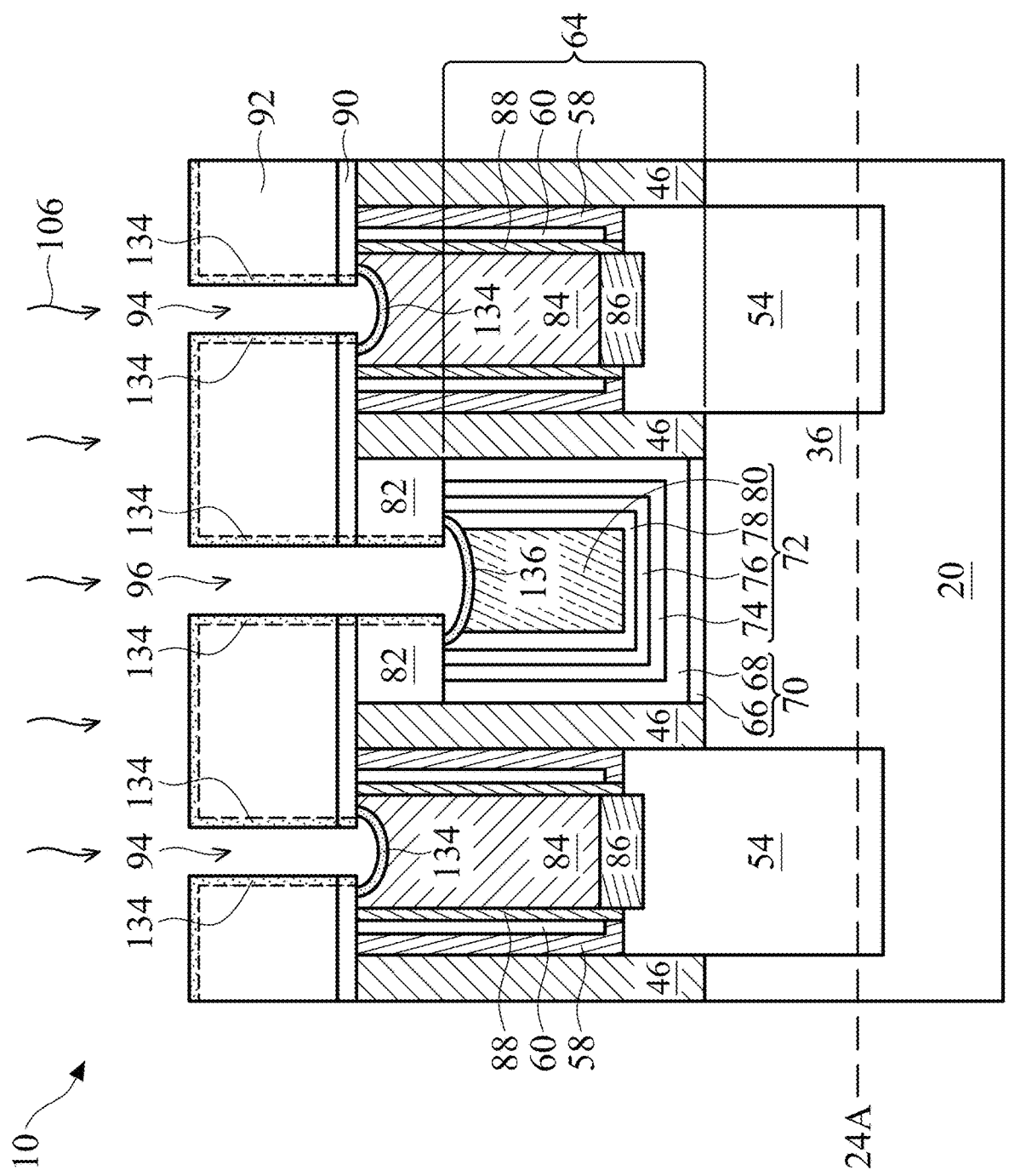
Figure 20:
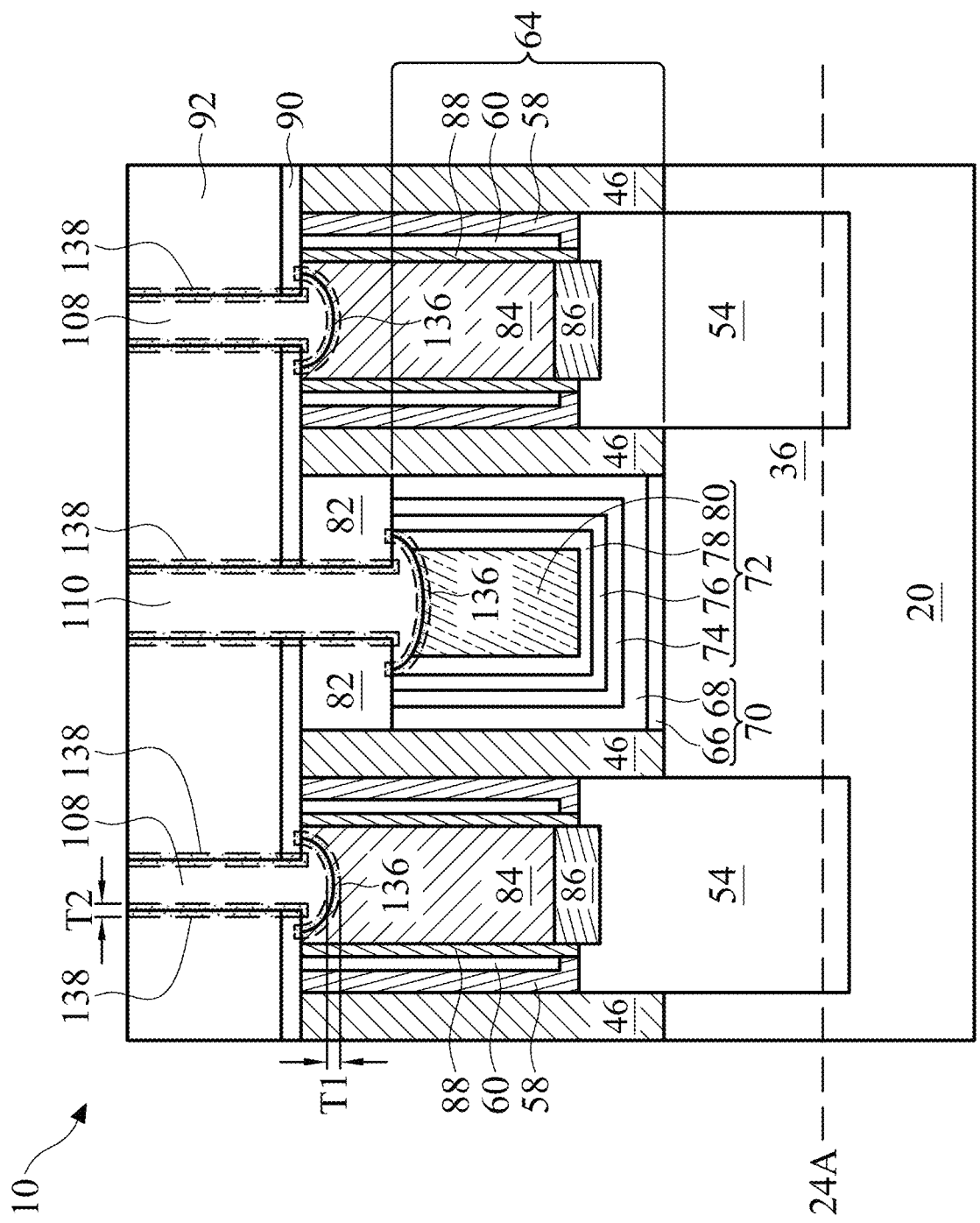

FIGS. 18 through 20 illustrate the cross-sectional views of intermediate stages in the formation of a FinFET and contact plugs in accordance with alternative embodiments of the present disclosure. Unless specified otherwise, the materials and the formation processes of the components in these embodiments are essentially the same as the like components, which are denoted by like reference numerals in the preceding embodiments shown in FIGS. 1-7, 8A, 8B, 9, 10, 11A, 11B, and 12-16. The details regarding the formation process and the materials of the components shown in FIGS. 18 through 20 may thus be found in the discussion of the embodiment shown in the preceding embodiments.

The initial steps of these embodiments are essentially the same as shown in FIGS. 1-7, 8A, 8B, 9, 10, 11A, 11B, and 12-13. Next, as shown in FIG. 18, a first treatment 128 is performed to selectively deposit doping-element-containing layers 130 in openings 94 and 96, and on contact plugs 84 and gate electrode 72. The deposition may be performed in a CVD chamber, with plasma turned on, and the respective precursor comprises a doping element, which may include silicon, boron, and phosphorous, or a combination thereof. For example, when silicon is to be deposited for the treatment, $SiH_4$, $Si_2H_6$, or the like may be introduced. When boron is to be deposited, $BH_3$, $B_2H_6$, or the like, may be used. When phosphorous is to be deposited, $PH_3$ or the like may be used. In accordance with some embodiments, the deposition may be performed with a flow rate of the aforementioned precursor being in the range between about 10 sccm and about 500 sccm, the wafer temperature being in the range between about 100 degrees and about 400 degrees, and the chamber pressure being in the range between about 100 mTorr and about 3 Torr. The resulting layer 130 may have a thickness in the range between about 3 Å and about 30 Å. Doping-element-containing layers 130 may or may not be formed on the surfaces of dielectric layer 92 and ESL 90.

FIG. 19 illustrates the second treatment 106. The details of this process may be found in the discussion of the treatment 106 as shown in FIG. 15, and thus the details are not repeated herein. As a result of the second treatment 106, the undesirable elements introduced by the etching process (FIG. 13) may be removed. The deposited doping-element-containing layers 130 are turned into layer 134, which are similar to doping-element-containing layers 130, but include purer silicon, boron, or phosphorous. In accordance with some embodiments, the atomic percentage of silicon, boron, or phosphorous in layer 134 may be higher than about 2 percent, and may be in the range between about 2 percent and about 20 percent.

In accordance with alternative embodiments, instead of depositing layer 130, an implantation process may be performed, with silicon, boron, phosphorous, arsenic, or combinations thereof, implanted. Accordingly, the doping-element-containing layers 130 in FIG. 18 represent the implanted surface layers of contact plugs 84 and gate electrode 72, and the implanted surface layers of dielectric layer 92 and ESL 90. The implantation is performed using a low energy, for example, lower than about 10 keV, so that a shallow surface layer of each of contact plugs 84 and gate electrode 72 is implanted. For example, the implanted species may be distributed within a surface layer of contact plugs 84 and gate electrode 72 having a thickness smaller than about 50 Å. The implantation may also include a vertical implantation and a tilt implantation, so that doping-element-containing layers 130 may be formed on the sidewalls of dielectric layer 92 and ESL 90. The tilt implantation may be performed with wafer 10 being rotated, and the tile angle may be, for example, between about 10 degrees and about 20 degrees. It is appreciated that due to the shadowing of dielectric layer 92, the implanted species is more concentrated to a region vertically aligned to the respective openings 94 and 96. After the implantation (the first treatment), the second treatment 106 as shown in FIG. 19 may be performed. The second treatment 106 may be essentially the same as in FIG. 15, and the details are not repeated herein.

FIG. 20 illustrates the selective bottom-up deposition process to form contact plugs 108 and 110 in accordance with some embodiments. The deposition process may be essentially the same as discussed referring to FIG. 16, and hence the details are not repeated herein. When doping-element-containing layers 130 are deposited layers, since layers 130 are thin, tungsten may grow from the gaps between the molecules/atoms of the material of doping-element-containing layers 130. The effect of the elements in doping-element-containing layers 130 (deposited or implanted) makes the formed contact plugs 108 and 110 more likely to be β-W. Furthermore, the elements on the surfaces of, or inside, dielectric layer 92 and ESL 90 also makes the formed contact plugs 108 and 110 more likely to be β-W. Experimental results indicate that most (for example, more than 99 percent) of the contact plugs are formed of β-W in these embodiments. The device performance through the wafer 10 and the dies therein are thus more uniform. Although β-W has a higher resistivity than α-W, the within-wafer-uniformity is improved, which more than offsets the degradation due to the higher resistivity.

Due to the thermal processes such as the deposition of contact plugs 108 and 110 and subsequent thermal processes, in the final structure, the atoms of doping-element-containing layers 130 may diffuse into the overlying contact plugs 108 and 110 and the underlying contact plugs 84 and gate electrode 72, resulting in doping-element-rich regions 136 to be generated. The substantially pure doping-element-containing layers 130, on the other hand, may no longer exist. Doping-element-rich regions 136 include the bottom portions of contact plugs 108 and 110, and the top portions of contact plugs 84 and gate electrode 72. The concentrations of the doping element (such as silicon, boron, phosphorous, and/or arsenic) in doping-element-rich regions 136 are also higher than in the overlying portions of contact plugs 108 and 110 and the underlying portions of contact plugs 84 and gate electrode 72, which may be, or may not be, free from the doping elements. In accordance with some embodiments, thickness T1 of the doping-element-rich regions 136 may be in the range between about 3 Å and about 50 Å. Furthermore, the shape of doping-element-rich regions 136 may follow the shape of the interface between contact plugs 108 and 110 and the underlying contact plugs 84 and gate electrode 72.

Also, in the final structure, doping-element-rich regions 138 may be formed due to the diffusion of the doping element into contact plugs 108 and 110 and the surface layers of the dielectric layer 92 and ESL 90. Doping-element-rich regions 138 include some portions of dielectric layer 92 with the doping element diffused in, and hence these portions have higher concentrations of the doping element than the inner parts of dielectric layer 92. Furthermore, the doping element may diffuse into the sidewall portions of contact plugs 108 and 110 slightly, which may be distinguishable. Accordingly, these portions of contact plugs 108 and 110 have higher concentrations of the doping elements than in the inner parts of contact plugs 108 and 110, which may be free from the doping element. In accordance with some embodiments, thickness T2 of doping-element-rich regions 138 may be in the range between about 3 Å and about 50 Å.

Figure 21:
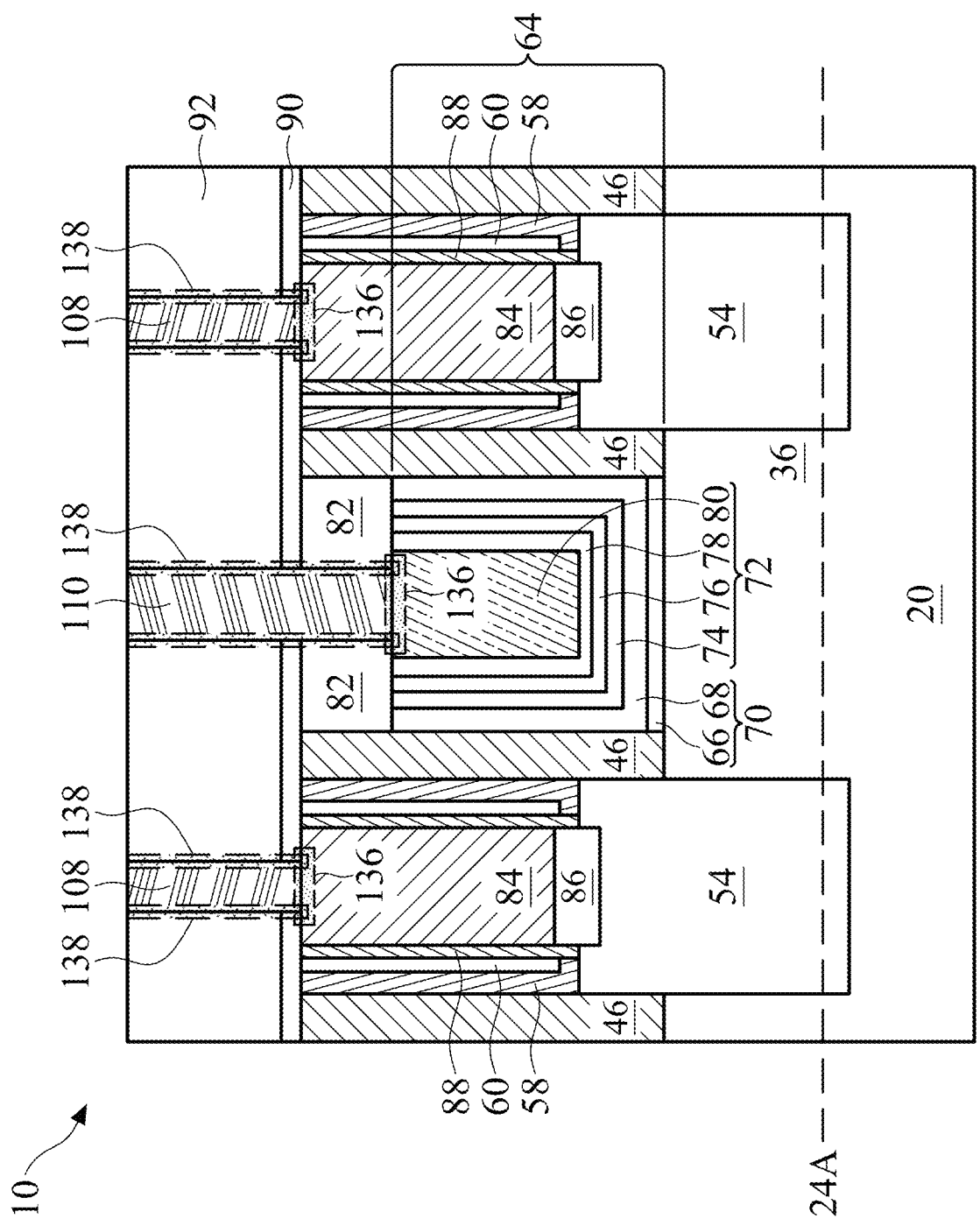
FIG. 21 illustrates a cross-sectional view of a FinFET and contact plugs in accordance with some embodiments.

FIG. 21 illustrates a structure formed in accordance with alternative embodiments, the formation processes for forming this structure are essentially the same for forming the structure shown in FIG. 20, except that when forming openings (FIG. 13), the bottoms of openings 94 and 96 are at substantially the same level as the bottom surfaces of ESL 90. The rest of the processes are essentially the same as in the previous embodiments. In the resulting structure, as shown in FIG. 21, the bottom parts of contact plugs 108 and 110 do not extend laterally to be directly under ESL 90 and ILD 92. Also, doping-element-rich regions 136 and 138 may be formed.

The embodiments of the present disclosure have some advantageous features. By performing treatments on the top surfaces of lower metal features before upper metal features are formed on the lower metal features, the upper metal features may have a more uniform phase formation, with most of the upper metal features having a same phase, and hence similar resistivity. Accordingly, the within-wafer uniformity of the device performance of the devices that include the upper metal features is more uniform.

In accordance with some embodiments of the present disclosure, a method includes forming a first metallic feature; forming a dielectric layer over the first metallic feature; etching the dielectric layer to form an opening, wherein a top surface of the first metallic feature is exposed through the opening; performing a first treatment on the top surface of the first metallic feature, wherein the first treatment is performed through the opening, and the first treatment is performed using a first process gas; after the first treatment, performing a second treatment, wherein the second treatment is performed through the opening, and the second treatment is performed using a second process gas different from the first process gas; and depositing a second metallic feature in the opening. In an embodiment, the first treatment is performed using the first process gas comprising oxygen ($O_2$), and the second treatment is performed using the second process gas comprising hydrogen ($H_2$). In an embodiment, the first treatment comprises a plasma treatment. In an embodiment, the first treatment comprises a thermal treatment. In an embodiment, the depositing the second metallic feature comprises a bottom-up deposition of tungsten. In an embodiment, the first treatment is performed using the first process gas comprising a silicon-containing process gas, a boron-containing process gas, a phosphorous-containing process gas, or combinations thereof. In an embodiment, the first treatment results in a layer comprising silicon, boron, phosphorous, or combinations thereof, to be deposited. In an embodiment, the first metallic feature comprises a source/drain contact plug. In an embodiment, the first metal feature comprises a gate electrode, and the second metallic feature comprises a contact plug.

In accordance with some embodiments of the present disclosure, a method includes forming a first metallic feature, wherein the first metallic feature comprises a gate electrode or a source/drain contact plug of a transistor; forming an etch stop layer over the first metal feature; forming a dielectric layer over the etch stop layer; etching the dielectric layer and the etch stop layer to form an opening, with the first metallic feature exposed to the opening; oxidizing a surface layer of the first metallic feature to form a metal oxide layer at a surface of the first metallic feature; performing an reduction reaction to reduce the metal oxide layer back to an elemental metal; and performing a bottom-up deposition process to deposit a tungsten plug in the opening. In an embodiment, the oxidizing is performed using oxygen ($O_2$) as a process gas. In an embodiment, the reduction reaction is performed using hydrogen ($H_2$) as a process gas. In an embodiment, the oxidizing the surface layer is performed through plasma oxidation. In an embodiment, the oxidizing the surface layer is performed through thermal oxidation. In an embodiment, the tungsten plug has an alpha phase.

In accordance with some embodiments of the present disclosure, an integrated circuit device includes a first metallic feature comprising a first portion and a second portion over the first portion, wherein the second portion comprises an element selected from the group consisting essentially of silicon, boron, phosphorus, arsenic, and combinations thereof, and the first portion is free from the element; a dielectric layer over the first metallic feature; and a second metallic feature over the first metallic feature and having a portion in the dielectric layer, wherein the second metallic feature comprises a third portion and a fourth portion over the third portion, with the third portion over and contacting the second portion to form an interface therebetween, and wherein the third portion comprises the element, and the fourth portion is free from the element. In an embodiment, the integrated circuit device further includes an element-rich region adjacent to an interface between sidewalls of the second metallic feature and the dielectric layer, wherein the element-rich region comprises the element, and the element-rich region comprises a sidewall surface portion of the second metallic feature and a sidewall surface portion of the dielectric layer. In an embodiment, the element comprises silicon. In an embodiment, the first metallic feature comprises a lower source/drain contact plug or a gate electrode of a transistor, and the second metallic feature comprises an upper source/drain contact plug or a gate contact plug of the transistor. In an embodiment, the second metallic feature comprises tungsten.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
   a semiconductor region;
   a gate stack over the semiconductor region;
   a source/drain region aside of the gate stack;
   a first source/drain contact plug over and electrically connecting to the source/drain region;
   a first inter-layer dielectric, wherein the gate stack and the first source/drain contact plug are in the first inter-layer dielectric;
   a second inter-layer dielectric over the first inter-layer dielectric;
   a second source/drain contact plug in the second inter-layer dielectric, wherein the second source/drain contact plug forms an interface with the second inter-layer dielectric; and
   a doping-element-rich layer comprising a first portion in both of the second inter-layer dielectric and the second source/drain contact plug, wherein the doping-element-rich layer has a higher atomic percentage of a dopant than remaining portions of the second inter-layer dielectric and the second source/drain contact plug, wherein the remaining portions are spaced apart from the first portion of the doping-element-rich layer, and wherein the dopant is selected from the group consisting of silicon, boron, phosphorous, and combinations thereof.

2. The structure of claim 1, wherein the second source/drain contact plug comprises a bottom portion in the first source/drain contact plug to form an additional interface, and wherein the doping-element-rich layer further comprises a second portion at the additional interface.

3. The structure of claim 2, wherein the additional interface has a rounded cross-sectional view shape.

4. The structure of claim 2, wherein the first portion of the doping-element-rich layer is physically disconnected from the second portion of the doping-element-rich layer.

5. The structure of claim 2, wherein a part of the second portion of the doping-element-rich layer is overlapped by the second inter-layer dielectric.

6. The structure of claim 1 further comprising:
   a gate contact plug over and contacting the gate stack to form an additional interface; and
   an additional doping-element-rich layer comprising the dopant, wherein the additional interface is in the additional doping-element-rich layer.

7. The structure of claim 1, wherein the dopant comprises silicon.

8. The structure of claim 1, wherein the dopant comprises boron.

9. The structure of claim 1, wherein the dopant comprises phosphorous.

10. The structure of claim 1 further comprising an etch stop layer between and contacting the first inter-layer dielectric and the second inter-layer dielectric, wherein the doping-element-rich layer further comprising a portion in the etch stop layer.

11. A structure comprising:
    a transistor comprising a gate stack and a source/drain region aside of the gate stack;
    a first source/drain contact plug over and electrically connecting to the source/drain region;
    a first inter-layer dielectric, wherein the gate stack and the first source/drain contact plug comprise portions in the first inter-layer dielectric;
    a second inter-layer dielectric over the first inter-layer dielectric;
    a second source/drain contact plug forming a vertical interface with the second inter-layer dielectric; and
    a dopant selected from the group consisting of silicon, boron, phosphorous, and combinations thereof, wherein the dopant has:
       a first concentration at the vertical interface;
       a second concentration in a first region of the second source/drain contact plug, wherein the first region is spaced apart from the vertical interface; and
       a third concentration in a second region of the second inter-layer dielectric, wherein the second region is spaced apart from the vertical interface, and wherein the second concentration and the third concentration are lower than the first concentration.

12. The structure of claim 11, wherein the dopant comprises silicon.

13. The structure of claim 11, wherein the first source/drain contact plug and the second source/drain contact plug form an interface region, wherein the interface region comprises portions of both of the first source/drain contact plug and the second source/drain contact plug, and wherein the interface region comprises the dopant.

14. The structure of claim 13, wherein the interface region comprising the dopant comprises:
    a top end coplanar with a top surface of the first source/drain contact plug; and
    a bottom end lower than the top surface of the first source/drain contact plug.

15. The structure of claim 13, wherein the interface region comprising the dopant has a round cross-sectional view shape.

16. The structure of claim 11 further comprising a gate contact plug over and electrically connecting to the gate stack, wherein an additional interface region of the gate stack and the gate contact plug further comprises the dopant.

17. The structure of claim 16, wherein the dopant has a higher concentration at the additional interface region than in portions of the gate stack and the gate contact plug that are spaced apart from the additional interface region.

18. A structure comprising:
- a transistor comprising a gate stack and a source/drain region aside of the gate stack;
- a source/drain contact plug over and electrically coupling to the source/drain region; and
- a contact plug comprising a bottom portion inside a lower conductive feature to form a curved interface with the lower conductive feature, wherein:
    - the lower conductive feature comprises one of the gate stack and the source/drain contact plug; and
    - at the curved interface, a dopant has a first dopant concentration higher than a second dopant concentration of the dopant in an overlying part of the contact plug, and higher than a third dopant concentration of the dopant in an underlying part of the lower conductive feature.

19. The structure of claim 18, wherein the lower conductive feature comprises the gate stack.

20. The structure of claim 18, wherein the lower conductive feature comprises the source/drain contact plug.

* * * * *